US012804996B2

(12) United States Patent
Savant et al.

(10) Patent No.: US 12,804,996 B2
(45) Date of Patent: Nov. 17, 2026

(54) DOPANT PROFILE CONTROL IN GATE STRUCTURES FOR SEMICONDUCTOR DEVICES

(71) Applicant: Taiwan Semiconductor Manufacturing Co., Ltd., Hsinchu (TW)

(72) Inventors: Chandrashekhar Prakash Savant, Hsinchu (TW); Chia-Ming Tsai, Zhubei City (TW); Tien-Wei Yu, Kaohsiung (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 340 days.

(21) Appl. No.: 17/858,970

(22) Filed: Jul. 6, 2022

(65) Prior Publication Data

US 2022/0336289 A1 Oct. 20, 2022

Related U.S. Application Data

(63) Continuation of application No. 16/900,054, filed on Jun. 12, 2020, now Pat. No. 11,417,571.

(51) Int. Cl.
*H10D 84/85* (2025.01)
*H10D 30/01* (2025.01)
(Continued)

(52) U.S. Cl.
CPC ......... *H10D 84/038* (2025.01); *H10D 30/024* (2025.01); *H10D 30/6219* (2025.01);
(Continued)

(58) Field of Classification Search
CPC ....... H01L 21/823431; H01L 29/41791; H01L 29/66795; H01L 21/223; H01L 21/225;
(Continued)

(56) References Cited

U.S. PATENT DOCUMENTS 9,093,530 B2 7/2015 Huang et al.
9,171,929 B2 10/2015 Lee et al.
(Continued)

*Primary Examiner* — Chad M Dicke
*Assistant Examiner* — Valerie N Newton
(74) *Attorney, Agent, or Firm* — Sterne, Kessler, Goldstein & Fox P.L.L.C.

(57) ABSTRACT

A semiconductor device with different gate structure configurations and a method of fabricating the same are disclosed. The semiconductor device includes a fin structure disposed on a substrate, and first and second gate structures on the fin structure. The first and second gate structures includes first and second interfacial oxide layers, respectively, first and second high-K gate dielectric layers disposed on the first and second TO layers, respectively, and first and second dopant control layers disposed on the first and second HK gate dielectric layers, respectively. The second dopant control layer has a silicon-to-metal atomic concentration ratio greater than an Si-to-metal atomic concentration ratio of the first dopant control layer. The semiconductor further includes first and second work function metal layers disposed on the first and second dopant control layers, respectively, and first and second gate metal fill layers disposed on the first and second work function metal layers, respectively.

20 Claims, 31 Drawing Sheets

(51) Int. Cl.
*H10D 30/62* (2025.01)
*H10D 64/01* (2025.01)
*H10D 64/27* (2025.01)
*H10D 84/01* (2025.01)
*H10D 84/03* (2025.01)

(52) U.S. Cl.
CPC ..... *H10D 64/01338* (2026.01); *H10D 64/514* (2025.01); *H10D 84/0158* (2025.01)

(58) Field of Classification Search
CPC ............ H01L 21/385; H10D 64/01338; H10D 64/0134; H10D 84/85
See application file for complete search history.

(56) References Cited

U.S. PATENT DOCUMENTS

| | | | | |
|---|---|---|---|---|
| 9,214,555 | B2 | 12/2015 | Oxland et al. | |
| 9,236,267 | B2 | 1/2016 | De et al. | |
| 9,520,482 | B1 | 12/2016 | Chang et al. | |
| 9,548,303 | B2 | 1/2017 | Lee et al. | |
| 9,564,489 | B2 | 2/2017 | Yeo et al. | |
| 9,576,814 | B2 | 2/2017 | Wu et al. | |
| 9,601,342 | B2 | 3/2017 | Lee et al. | |
| 9,608,116 | B2 | 3/2017 | Ching et al. | |
| 9,960,053 | B2 * | 5/2018 | Hou | H01L 29/51 |
| 10,825,736 | B1 * | 11/2020 | Zhang | H10D 84/0144 |
| 2004/0232467 | A1 * | 11/2004 | Otsuki | C23C 16/34 257/303 |
| 2014/0252493 | A1 | 9/2014 | Frank et al. | |
| 2017/0005175 | A1 * | 1/2017 | Song | H01L 27/085 |
| 2018/0226300 | A1 * | 8/2018 | Song | H01L 21/823821 |
| 2020/0091011 | A1 * | 3/2020 | Khaderbad | H01L 21/823871 |
| 2020/0135475 | A1 * | 4/2020 | Cheng | H01L 21/823842 |
| 2020/0176446 | A1 * | 6/2020 | Franco | H01L 21/02178 |
| 2021/0391220 | A1 | 12/2021 | Savant et al. | |

* cited by examiner

DOPANT PROFILE CONTROL IN GATE STRUCTURES FOR SEMICONDUCTOR DEVICES

CROSS-REFERENCE TO RELATED APPLICATIONS

This application is a continuation of U.S. patent application Ser. No. 16/900,054, titled "Dopant Profile Control in Gate Structures for Semiconductor Devices," filed Jun. 12, 2020, which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 1A, 1B-1I, 1V-1W, and 1J-1U illustrate an isometric view, cross-sectional views, and device characteristics of a semiconductor device with different gate structures, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
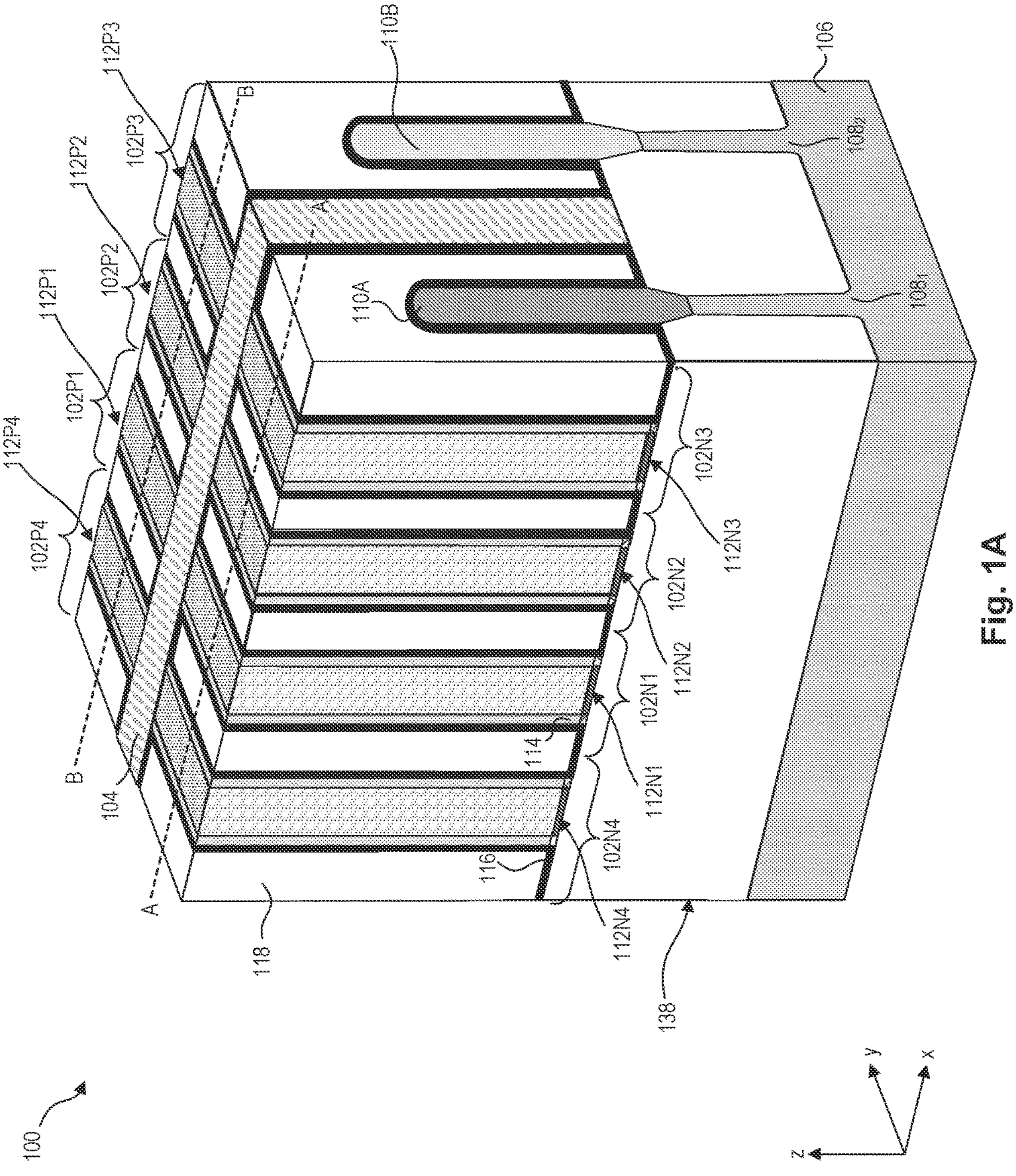

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a low dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "nanostructured" defines a structure, layer, and/or region as having a horizontal dimension (e.g., along an X- and/or Y-axis) and/or a vertical dimension (e.g., along a Z-axis) less than, for example, 100 nm.

As used herein, the term "n-type work function metal (nWFM)" defines a metal or a metal-containing material with a work function value closer to a conduction band energy than a valence band energy of a material of a FET channel region. In some embodiments, the term "n-type work function metal (nWFM)" defines a metal or a metal-containing material with a work function value less than 4.5 eV.

As used herein, the term "p-type work function metal (pWFM)" defines a metal or a metal-containing material with a work function value closer to a valence band energy than a conduction band energy of a material of a FET channel region. In some embodiments, the term "p-type work function metal (pWFM)" defines a metal or a metal-containing material with a work function value equal to or greater than 4.5 eV.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values of a given quantity as interpreted by those skilled in relevant art(s) in light of the teachings herein.

As used herein, the term "multi-threshold voltage (multi-Vt) device" defines a semiconductor device with two or more FETs, where each of the two or more FETs have a threshold voltage different from each other.

The fin structures disclosed herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The required gate voltage—the threshold voltage (Vt)—to turn on a field effect transistor (FET) can depend on the semiconductor material of the FET channel region and/or the effective work function (EWF) value of a gate structure of the FET. For example, for an n-type FET (NFET), reducing the difference between the EWF value(s) of the NFET gate structure and the conduction band energy of the material (e.g., 4.1 eV for Si or 3.8 eV for SiGe) of the NFET channel region can reduce the NFET threshold voltage. For a p-type FET (PFET), reducing the difference between the EWF value(s) of the PFET gate structure and the valence band energy of the material (e.g., 5.2 eV for Si or 4.8 eV for SiGe) of the PFET channel region can reduce the PFET threshold voltage. The EWF values of the FET gate structures can depend on the thickness and/or material composition of each of the layers of the FET gate structure. As such, FETs can be manufactured with different threshold voltages by adjusting the thickness and/or material composition of the FET gate structures.

Due to the increasing demand for multi-functional portable devices, there is an increasing demand for FETs with different threshold voltages on the same substrate. One way to achieve such multi-Vt device can be with different work function metal (WFM) layer thicknesses in the FET gate structures. However, the different WFM layer thicknesses can be constrained by the FET gate structure geometries. For example, in gate-all-around (GAA) FETs, the WFM layer thicknesses can be constrained by the spacing between the nanostructured channel regions of the GAA FETs. Also, depositing different WFM layer thicknesses can become increasingly challenging with the continuous scaling down of FETs (e.g., GAA FETs and/or finFETs).

The present disclosure provides example multi-Vt devices with FETs (e.g., GAA FETs and/or finFETs) having threshold voltages different from each other and provides example methods of forming such FETs on the same substrate. The example methods form NFETs and PFETs with WFM layer of similar thicknesses or without WFM layers, but with different threshold voltages on the same substrate. These example methods can be more cost-effective (e.g., cost reduced by about 20% to about 30%) and time-efficient (e.g., time reduced by about 15% to about 20%) in manufacturing reliable FET gate structures with different threshold voltages than other methods of forming FETs with similar channel dimensions and threshold voltages on the same substrate. In addition, these example methods can form FET gate structures with much smaller dimensions (e.g., thinner gate stacks) than other methods of forming FETs with similar threshold voltages.

In some embodiments, NFETs and PFETs with different gate structure configurations, but with similar WFM layer thicknesses can be selectively formed on the same substrate to achieve threshold voltages different from each other. The different gate structures can have dopant control layers of different compositions disposed on high-K (HK) gate dielectric layers. The different dopant control layers can provide different concentration profiles of metal dopants in the HK gate dielectric layers of the different gate structure. The different metal dopant concentration profiles can induce dipoles of different concentrations at interfaces between the HK gate dielectric layers and interfacial oxide (IO) layers (referred to as "HK-IO interfaces"). The different dipole concentrations result in gate structures with different EWF values and threshold voltages. Thus, tuning the composition of the dopant control layers can tune the EWF values of the NFET and PFET gate structures, and as a result can adjust the threshold voltages of the NFETs and PFETs without varying their WFM layer thicknesses.

With the use of the dopant control layers in the NFET and PFET gate structures, the different dipole concentrations at the HK-IO interfaces can be achieved with the HK gate dielectric layers doped with the same amount of metal dopants. As a result, the method of forming the dipole-based gate structures with the dopant control layers can be less complicated (e.g., fewer processing steps) and time efficient (e.g., time reduced by about 15% to about 20%) than other methods of forming dipole-based gate structures without the dopant control layers and with HK gate dielectric layers doped with different amounts of metal dopants for dipole of different concentrations. In addition, with the use of the dopant control layers, the HK gate dielectric layers of the dipole-based gate structures can be doped with a smaller amount of metal dopants than the HK gate dielectric layers of dipole-based gate structures without the dopant control layers to achieve the same threshold voltage. The reduction of dopant amounts in the HK gate dielectric layers can improve the NFET and PFET performance by reducing low frequency noise or 1/f noise, reducing metal dopant diffusion between adjacent FETs thereby avoiding metal boundary effects, and/or increasing the k-value of the HK gate dielectric layers.

A semiconductor device 100 having NFETs 102N1-102N4 and PFETs 102P1-102P4 is described with reference to FIGS. 1A-1U, according to some embodiments. FIG. 1A illustrates an isometric view of semiconductor device 100, according to some embodiments. FIGS. 1B, 1D, and 1F-1H illustrate cross-sectional views along line A-A of semiconductor device 100 of FIG. 1A, according to some embodiments. FIGS. 1C, 1E, and 1I illustrate cross-sectional views along line B-B of semiconductor device 100 of FIG. 1A, according to some embodiments. FIGS. 1J-1U illustrate devices characteristics of semiconductor device 100, according to some embodiments. Even though eight FETs are discussed with reference to FIGS. 1A-1U, semiconductor device 100 can have any number of FETs. The discussion of elements of NFETs 102N1-102N4 and PFETs 102P1-102P4 with the same annotations applies to each other, unless mentioned otherwise. The isometric view and cross-sectional views of semiconductor device 100 are shown for illustration purposes and may not be drawn to scale.

Figure 1B:
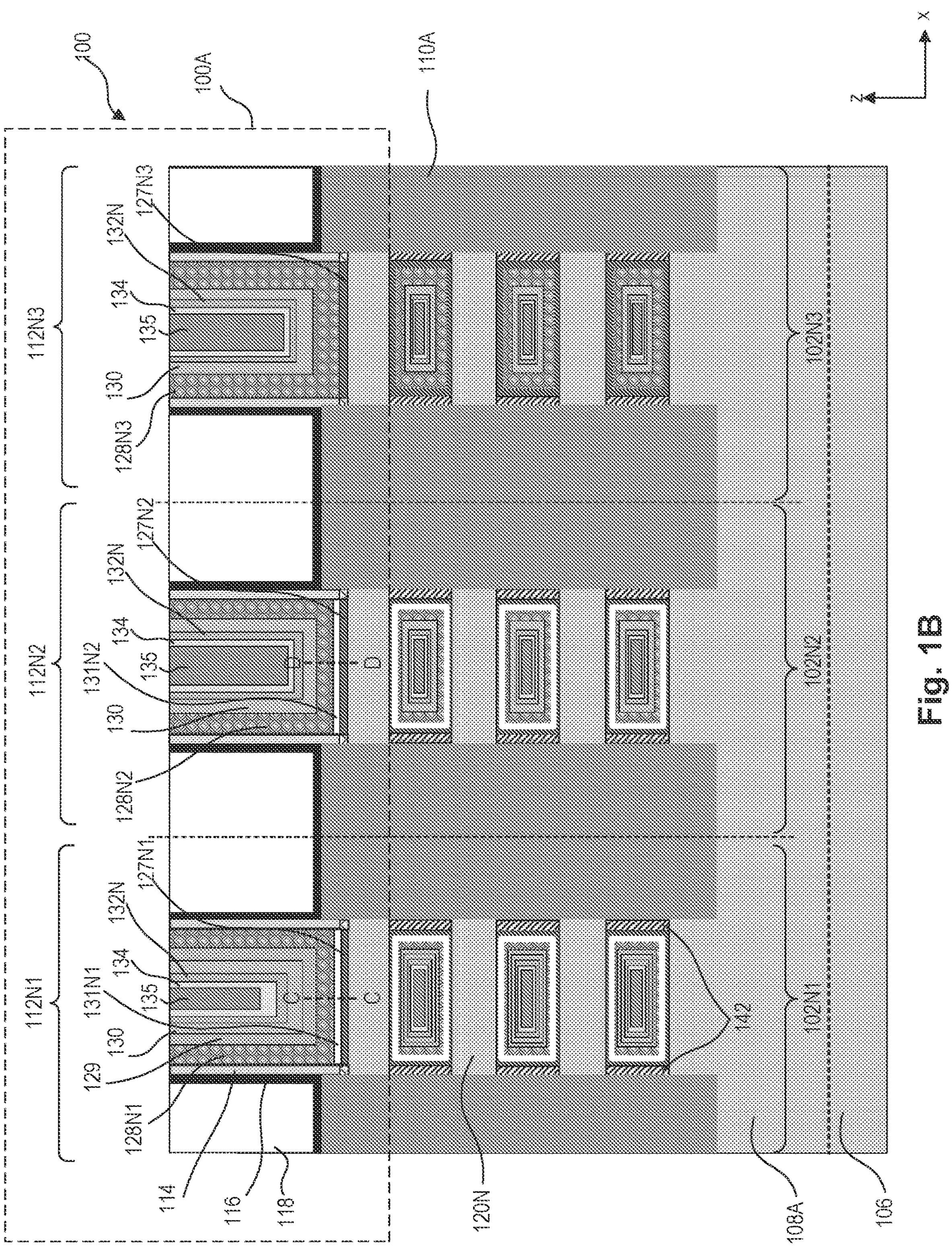
Figure 1C:
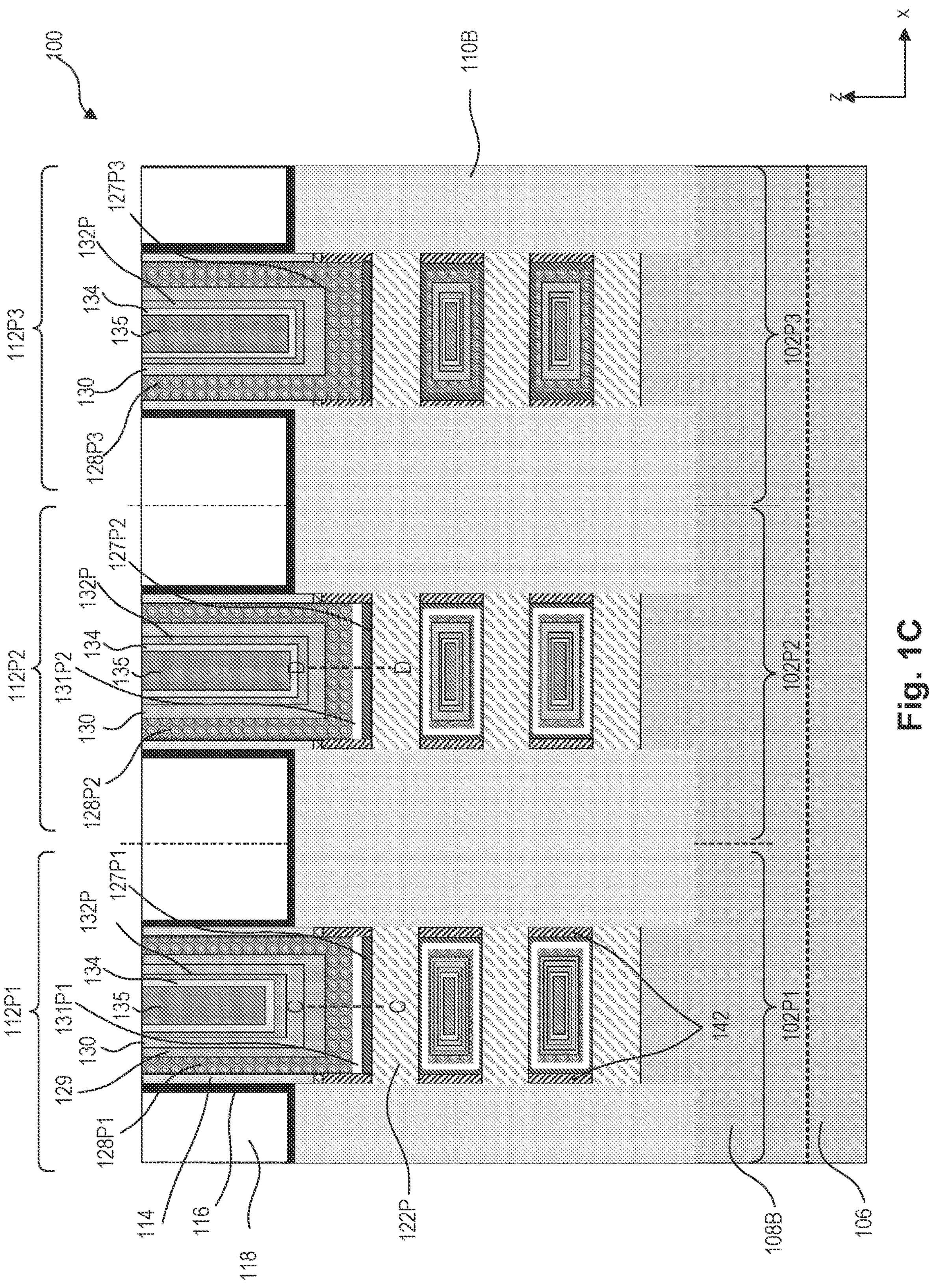

Referring to FIGS. 1A-1C, NFETs 102N1-102N4 and PFETs 102P1-102P4 can be formed on a substrate 106. Substrate 106 can be a semiconductor material, such as silicon, germanium (Ge), silicon germanium (SiGe), a silicon-on-insulator (SOI) structure, and a combination thereof. Further, substrate 106 can be doped with p-type dopants (e.g., boron, indium, aluminum, or gallium) or n-type dopants (e.g., phosphorus or arsenic).

NFETs 102N1-102N4 and PFETs 102P1-102P4 can include fin structures $\mathbf{108}_1$-$\mathbf{108}_2$ extending along an X-axis, epitaxial fin regions 110A-110B, gate structures 112N1-112N4 and 112P1-112P4, inner spacers 142, and gate spacers 114.

Referring to FIGS. 1B-1C, fin structure $\mathbf{108}_1$ can include a fin base portion 108A and nanostructured channel regions 120N disposed on fin base portion 108A, and fin structure $\mathbf{108}_2$ can include a fin base portion 108B and nanostructured channel regions 122P disposed on fin base portion 108B. In some embodiments, fin base portions 108A-108B can include a material similar to substrate 106. Nanostructured channel regions 120N can be wrapped around by gate structures 112N1-112N3 and nanostructured channel regions 122P can be wrapped around by gate structures 112P1-112P3. Nanostructured channel regions 120N and 122P can include semiconductor materials similar to or different from substrate 106 and can include semiconductor material similar to or different from each other.

In some embodiments, nanostructured channel regions 120N can include Si, SiAs, silicon phosphide (SiP), SiC, or silicon carbon phosphide (SiCP) for NFETs 102N1-102N3 and nanostructured channel regions 122P can include SiGe, silicon germanium boron (SiGeB), germanium boron (GeB), silicon germanium stannum boron (SiGeSnB), or a III-V semiconductor compound for PFETs 102P1-102P3. In some embodiments, nanostructured channel regions 120N and 122P can both include Si, SiAs, SiP, SiC, SiCP, SiGe, SiGeB, GeB, SiGeSnB, or a III-V semiconductor compound. Though rectangular cross-sections of nanostructured channel regions 120N and 122P are shown, nanostructured channel regions 120N and 122P can have cross-sections of other geometric shapes (e.g., circular, elliptical, triangular, or polygonal).

Epitaxial fin regions 110A-110B can be grown on fin base portions 108A-108B, respectively, and can be source/drain (S/D) regions of NFETs 102N1-102N4 and PFETs 102P1-102P4. Epitaxial fin regions 110A-110B can include epitaxially-grown semiconductor materials similar to or different from each other. In some embodiments, the epitaxially-grown semiconductor material can include the same material or a different material from the material of substrate 106. Epitaxial fin regions 110A and 110B can be n- and p-type, respectively. In some embodiments, n-type epitaxial fin regions 110A can include SiAs, SiC, or SiCP. P-type epitaxial fin regions 110B can include SiGe, SiGeB, GeB, SiGeSnB, a III-V semiconductor compound, or a combination thereof.

Gate structures 112N1-112N4 and 112P1-112P4 can be multi-layered structures. Gate structures 112N1-112N4 can be wrapped around nanostructured channel regions 120N and gate structures 112P1-112P4 can be wrapped around nanostructured channel regions 122P for which gate structures 112N1-112N4 and 112P1-112P4 can be referred to as "gate-all-around (GAA) structures" or "horizontal gate-all-around (HGAA) structures." NFETs 102N1-102N4 and PFETs 102P1-102P4 can be referred to as "GAA FETs 102N1-102N4 and 102P1-102P4" or "GAA NFETs 102N1-102N4 and PFETs 102P1-102P4."

Figure 1D:
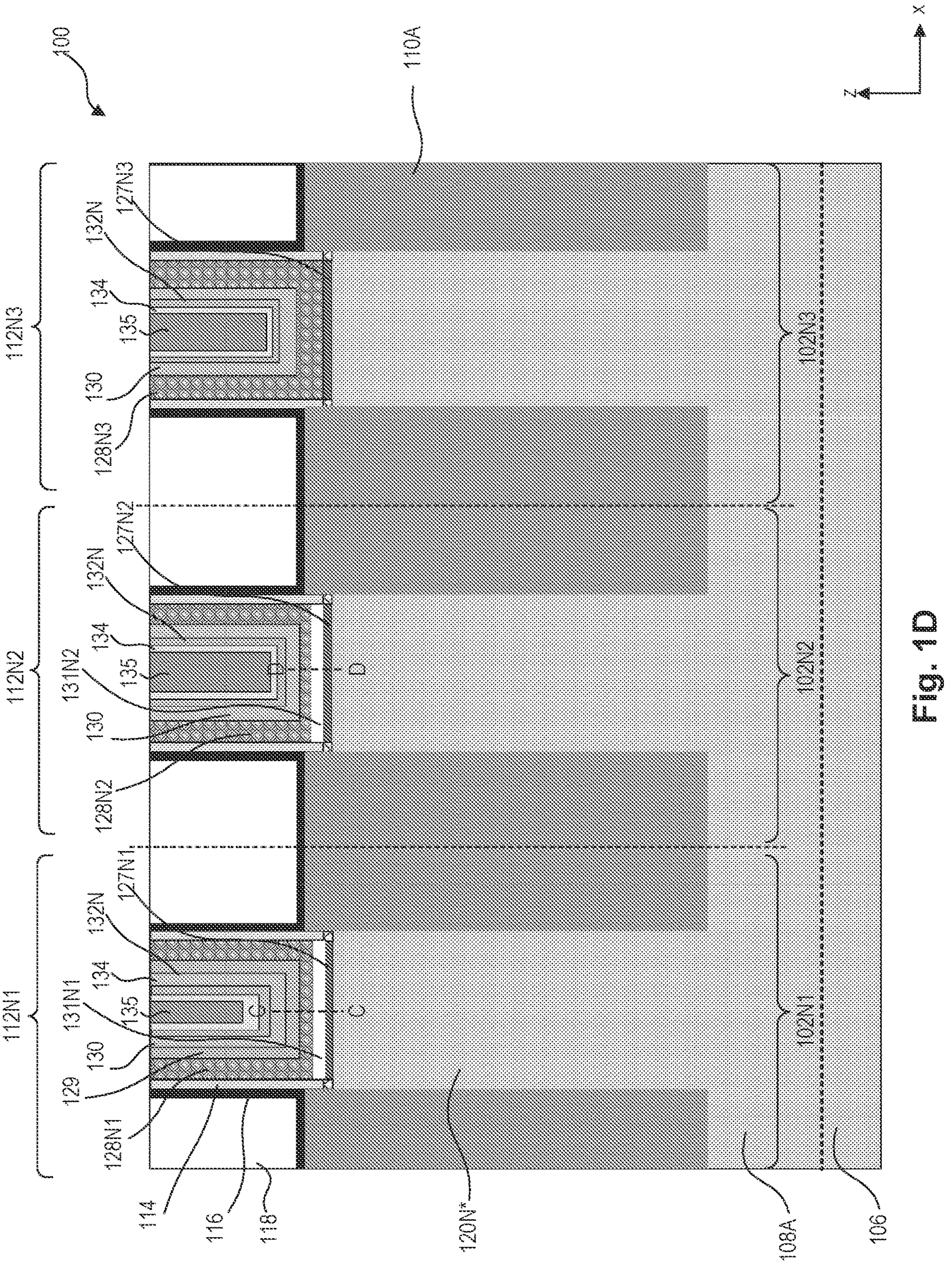
Figure 1E:
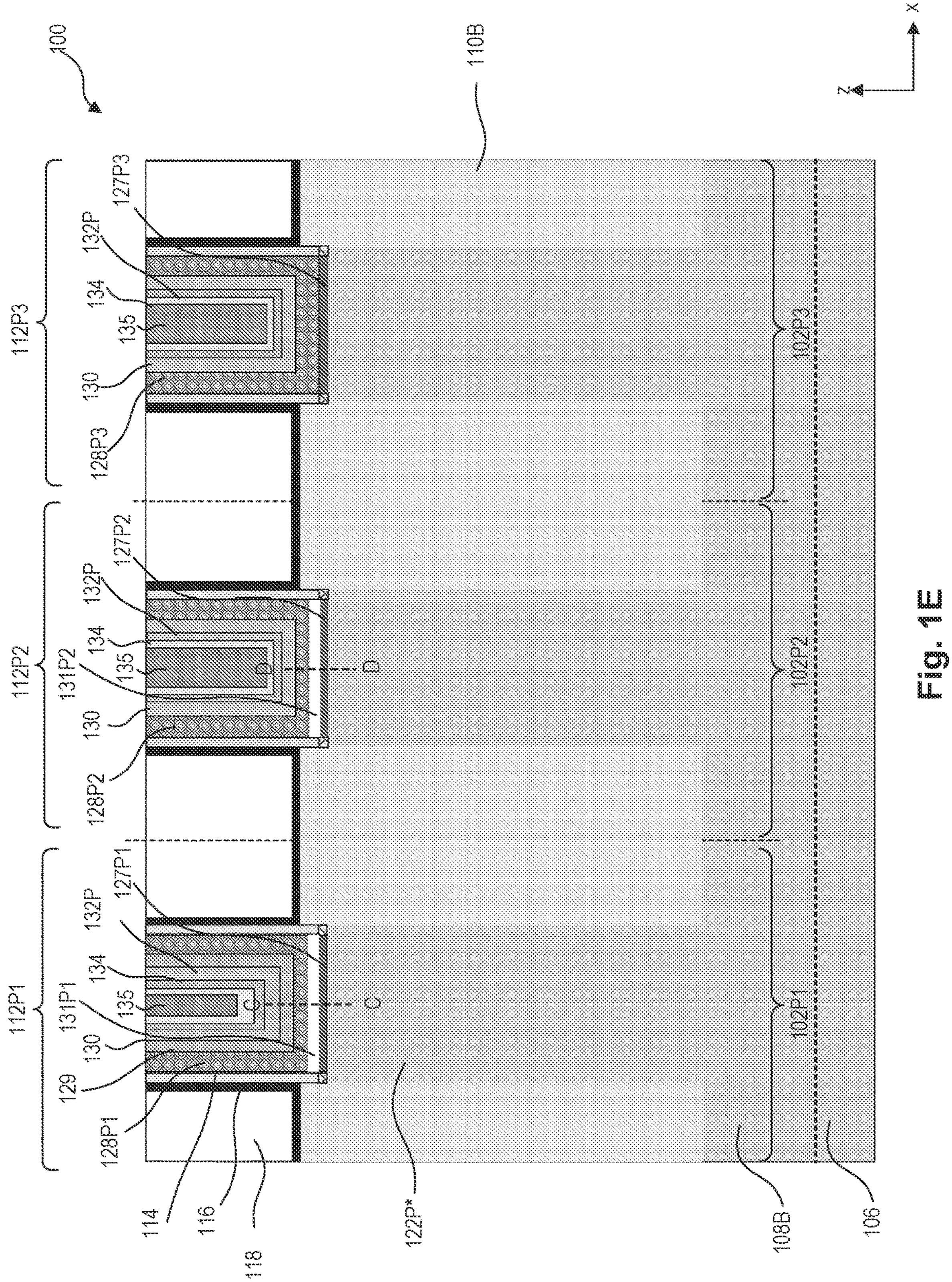
Figure 1F:
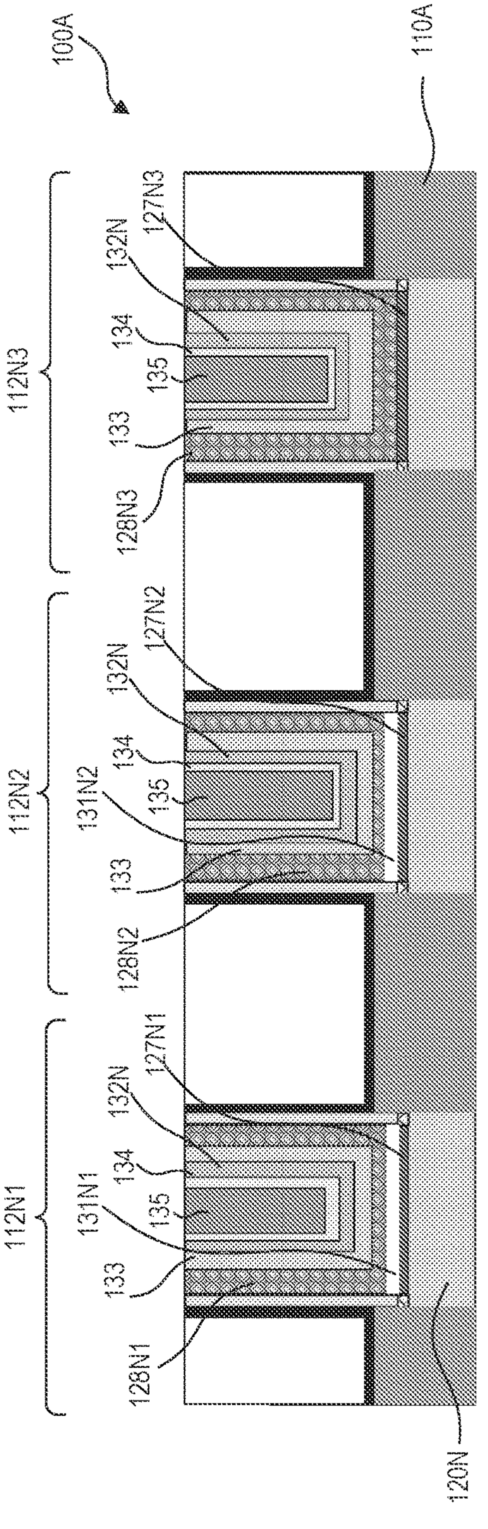
Figure 1G:
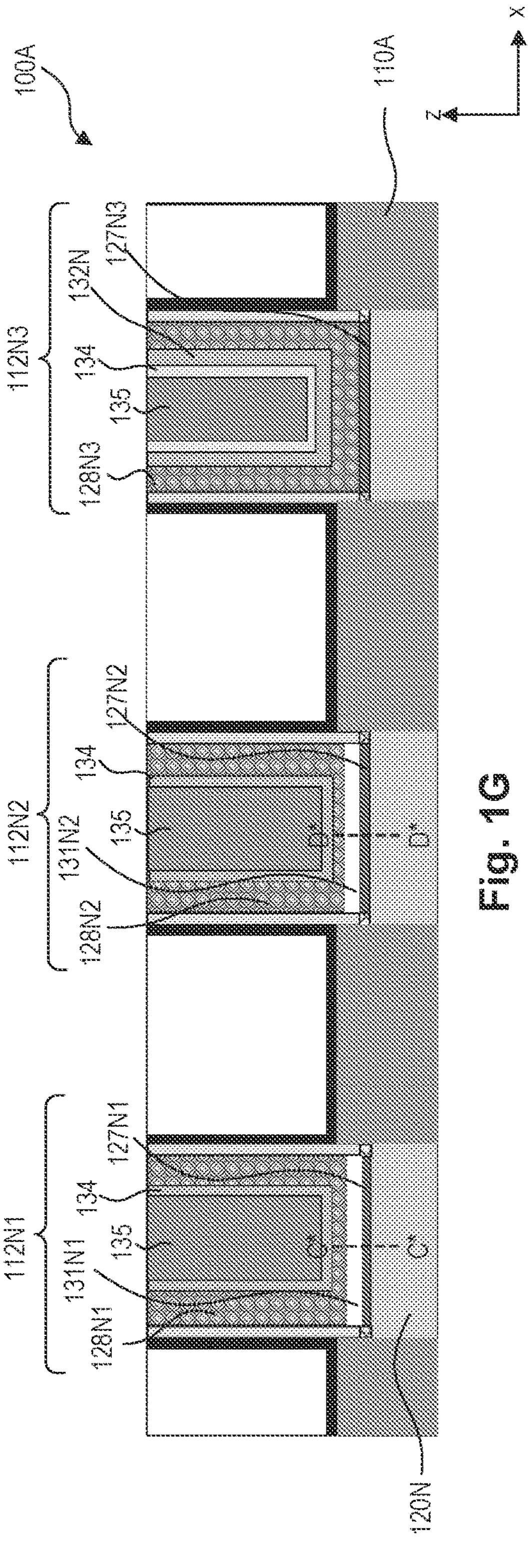
Figure 1H:
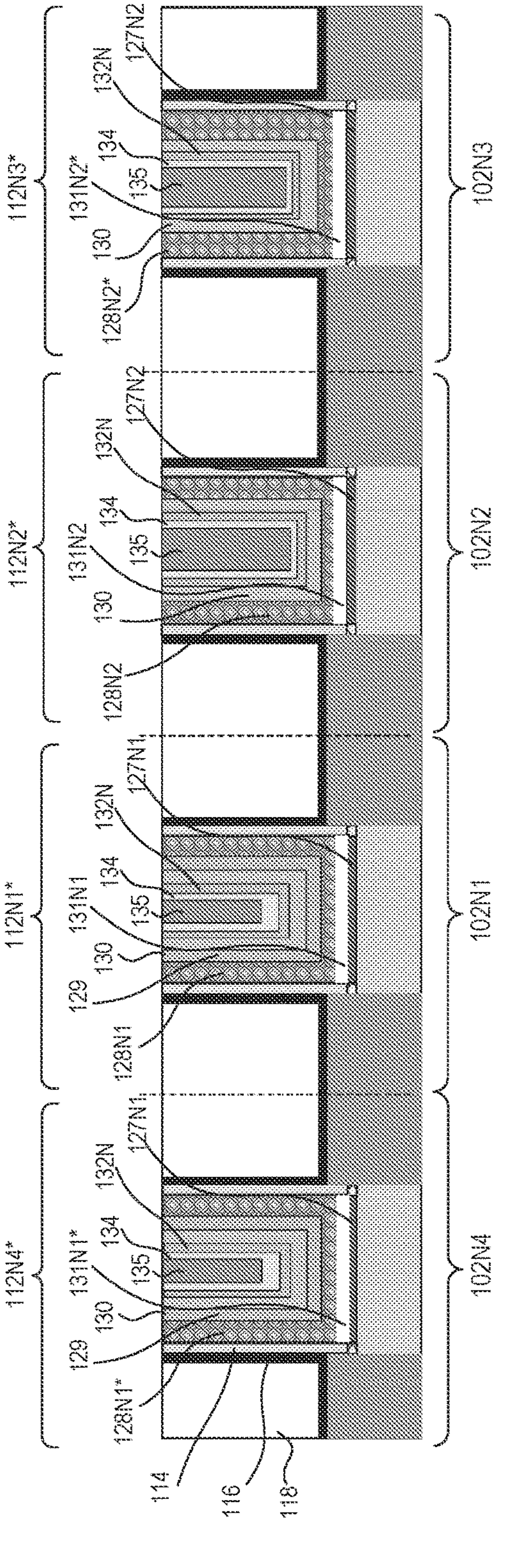
Figure 1I:
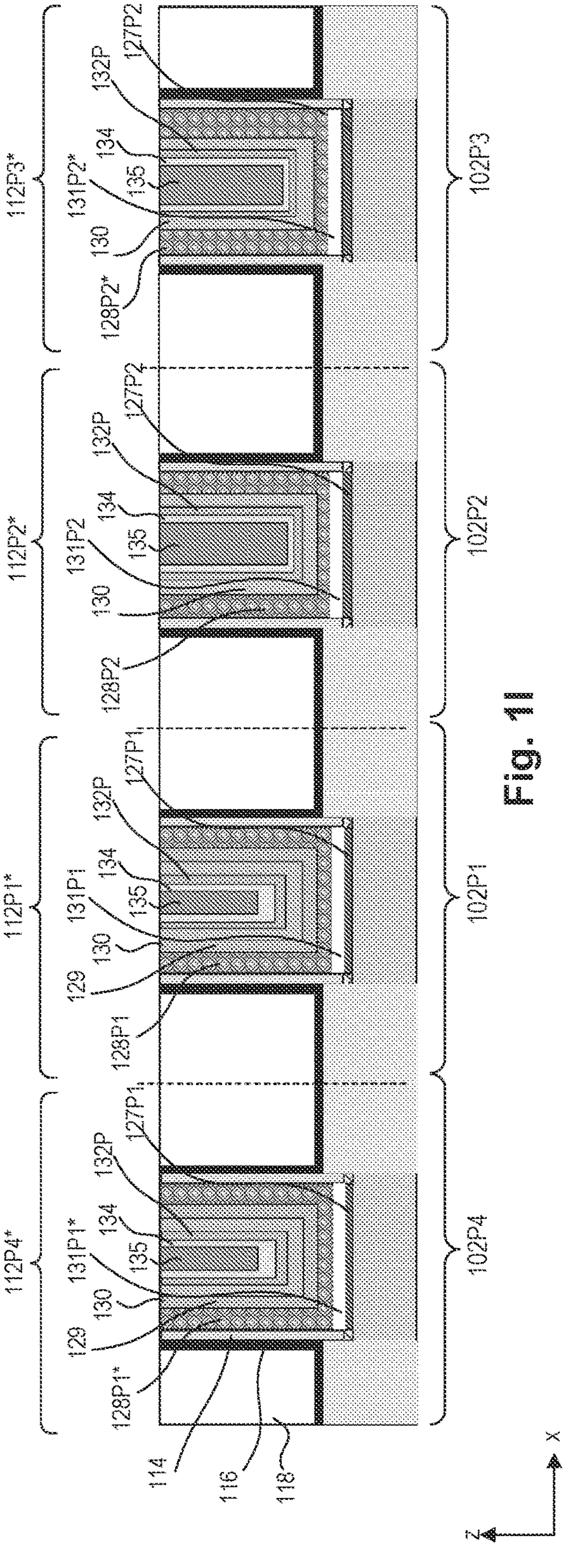
Figure 1J:
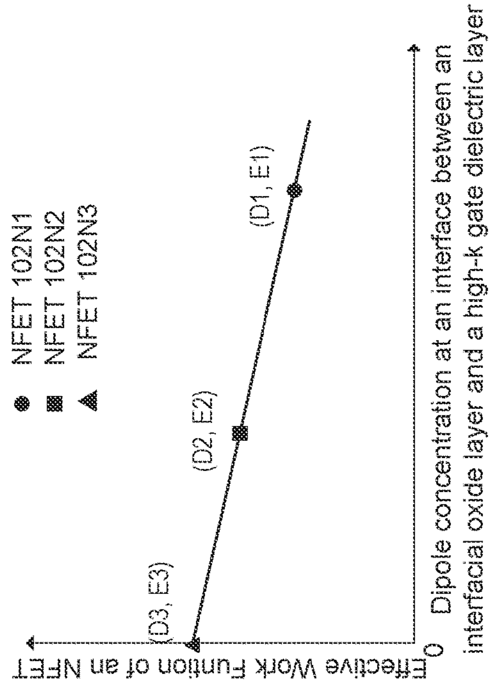
Figure 1K:
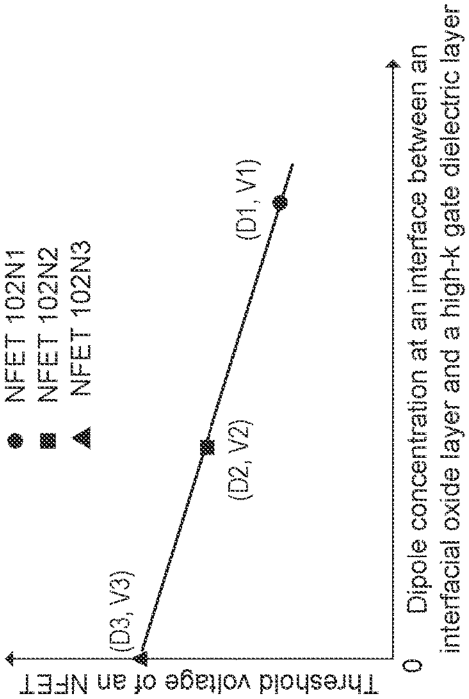
Figure 1L:
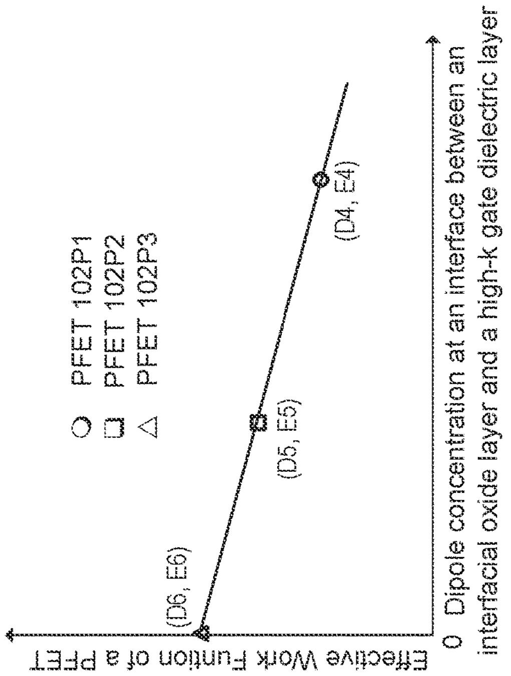
Figure 1M:
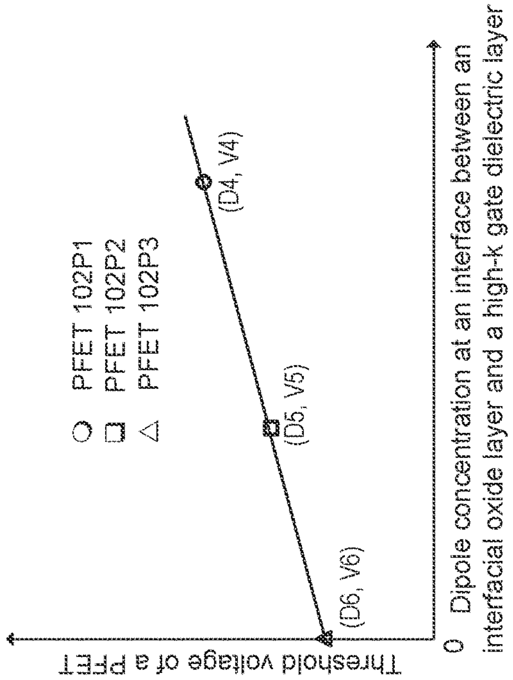

In some embodiments, NFETs 102N1-102N3 and PFETs 102P1-102P3 can be finFETs and have fin regions 120N* and 122P* instead of nanostructures channel regions 120N and 122P, as shown in FIGS. 1D-1E. Such finFETs 102N1-102N3 and 102P1-102P3 can have gate structures 112N1-112N3 and 112P1-112P3 disposed on fin regions 120N* and 122P* as shown in FIGS. 1D-1E.

Gate structures 112N1-112N3 and 112P1-112P3 can include (i) interfacial oxide (IO) layers 127N1-127N3 and 127P1-127P3, (ii) HK gate dielectric layers 128N1-128N3 and 128P1-128P3, (iii) second dopant control layers 130, (iv) WFM layers 132N-132P, (vii) fluorine-free tungsten (FFW) layers 134, and (viii) gate metal fill layers 135. Gate structures 112N1-112N2 and 112P1-112P2 can further include dipole layers 131N1-131N2 and 131P1-131P2, respectively, and gate structures 112N1-112P1 can further include first dopant control layer layers 129. Though FIGS. 1B-1C show that all the layers of gate structures 112N1-112N3 and 112P1-112P3 are wrapped around nanostructured channel regions 120N and 122P, nanostructured channel regions 120N can be wrapped around by at least IO layers 127N1-127N3 and HK gate dielectric layers 128N1-128N3 to fill the spaces between adjacent nanostructured channel regions 120N. As such, nanostructured channel regions 120N can be electrically isolated from each other to prevent shorting between gate structures 112N1-112N3 and S/D regions 110A during operation of NFETs 102N1-102N3. Similarly, nanostructured channel regions 122P can be wrapped around by at least IO layers 127P1-127P3 and HK gate dielectric layers 128P1-128P3 nanostructured channel regions 120P to electrically isolated nanostructured channel regions 122P from each other to prevent shorting between gate structures 112P1-112P3 and S/D regions 110B during operation of PFETs 102P1-102P3.

The discussion of IO layers 127N1-127N3 applies to IO layers 127P1-127P3, respectively, unless mentioned otherwise. IO layers 127N1-127N3 can be disposed on nanostructured channel regions 120N, and IO layers 127P1-127P3 can be disposed on nanostructured channel regions 122P. IO layers 127N1-127N3 can include silicon oxide ($SiO_2$, SiOH) and a thickness ranging from about 0.5 nm to about 1.5 nm. IO layers 127P1-127P3 can include silicon oxide ($SiO_2$, SiOH), silicon germanium oxide ($SiGeO_x$) or germanium oxide ($GeO_x$) and a thickness ranging from about 0.5 nm to about 1.5 nm. In some embodiments, the thickness of IO layers 127N1-127N2 and 127P1-127P2 can be different from each other based on the material composition of first and second dopant control layers 129-130, respectively.

The discussion of HK gate dielectric layers 128N1-128N3 applies to HK gate dielectric layers 128P1-128P3, respectively, unless mentioned otherwise. HK gate dielectric layers 128N1-128N3 can be disposed on respective IO layers 127N1-127N3, and HK gate dielectric layers 128P1-128P3 can be disposed on respective IO layers 127P1-127P3. Each of HK gate dielectric layers 128N1-128N3 can have a thickness (e.g., about 1 nm to about 3 nm) that is about 2 to 3 times the thickness of IO layers 127N1-127N3 and can include (i) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$) and (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), or (iii) a combination thereof.

HK gate dielectric layers 128N1-128N2 can be doped with metals that induce the formation of dipole layers 131N1-131N2, and HK gate dielectric layers 128P1-128P2 can be doped with metals that induce the formation of dipole layers 131P1-131P2. Dipole layer 131N1 can be induced at the interface between HK gate dielectric layer 128N1 and IO layer 127N1 (also referred to as "HKN1-ION1 interface"), and dipole layer 131N2 can be induced at the interface between HK gate dielectric layer 128N2 and IO layer 127N2 (also referred to as "HKN2-ION2 interface") as shown in FIG. 1B. Similarly, dipole layers 131P1-131P2 can be induced at the interfaces between HK gate dielectric layers 128P1-128P2 and IO layers 127P1-127P2 (also referred to as "HKP1-IOP1 interface" and "HKP2-IOP2 interface") as shown in FIG. 1C. HK gate dielectric layers 128N3-128P3 can be undoped and as a result, may not have dipole layers at the interfaces between HK gate dielectric layers 128N3-128P3 and IO layers 127N3-127P3 (also referred to as "HKN3-ION3 interface" and "HKP3-IOP3 interface") as shown in FIGS. 1B-1C.

In some embodiments, HK gate dielectric layers 128N1-128N2 can be doped with (i) a rare-earth metal, such as Lanthanum (La), Yttrium (Y), Scandium (Sc), Cerium (Ce), Ytterbium (Yb), Erbium (Er), Dysprosium (Dy) and Lutetium (Lu); (ii) a metal from group IIA (e.g., magnesium (Mg) or strontium (Sr)), group IIIA (e.g., aluminum (Al)), group IIIB (e.g., yttrium (Y)), or group IVB (e.g., zirconium (Zr), hafnium (Hf) or titanium (Ti)) of the periodic table; or (iii) a combination thereof. HK gate dielectric layers 128N1-128N2 can be doped with dopants similar to or different from the dopants of HK gate dielectric layers 128P1-128P2. In some embodiments, HK gate dielectric layers 128N1-128N2 and 128P1-128P2 can be doped with La or $La_2O_3$. In some embodiments, HK gate dielectric layers 128N1-128N2 can be doped with Y, Sr, Lu, La, $Y_2O_3$, SrO, $Lu_2O_3$, $La_2O_3$, or a combination thereof to improve the n-type performance of NFETs 102N1-102N2, while HK gate dielectric layers 128P1-128P2 can be doped with Ti, Zr, $Al_2O_3$, $TiO_2$, $ZrO_2$, or a combination thereof to improve the p-type performance of PFETs 102P1-102P2.

The formation of dipoles from dipole layers 131N1-131N2 and 131P1-131P2 depend on the dopants of HK gate dielectric layers 128N1-128N2 and 128P1-128P2, respectively. Dipole layers 131N1-131N2 can give rise to specially charged dipoles of oxygen ions and/or of metal ions from dopants and/or ions from dopant layers 129-130 and IO layers 127P1-127P2 and difference in the oxygen ions density between IO layers 127N1-127N2, dopant metal oxides and HK gate dielectric layer 128N1-128N2. Similarly, dipole layers 131P1-131P2 can give rise to specially charged dipoles arising from migration of metal ions from dopants of HK gate dielectric layers 128P1-128P2 and/or oxygen ions from IO layers 127P1-127P2 and metal dopant oxide, and/or metal/metalloid ions from IO layers 127P1-127P2. For example, dipole layers 131N1-131N2 and 131P1-131P2 can give rise to La—O dipoles for HK gate dielectric layers 128N1-128N2 and 128P1-128P2 doped with La or $La_2O_3$ dopants. Dipole concentrations D1-D2 in dipole layers 131N1-131N2 depend on the dopant concentrations near and/or at HKN1-ION1 and HKN2-ION2 interfaces. Similarly, dipole concentrations D4-D5 in dipole layers 131P1-131P2 depend on the dopant concentrations near and/or at HKP1-IOP1 and HKP2-IOP2 interfaces. Dipole concentrations D3 and D6 in NFET 102N3 and PFET 102P3 can be equal to zero because of the undoped HK gate dielectric layers 128N3 and 128P3, respectively. The dipole concentration refers to the amount of dipole per unit volume. In some embodiments, the dipoles from dipole layers 131N1-131N2 can have a polarity similar to a polarity of the dipoles from dipole layers 131P1-131P2. In some embodiments, the dipoles from dipole layers 131N1-131N2 can have a polarity opposite to a polarity of the dipoles from dipole layers 131P1-131P2, when different dopants are used in NFETs and PFETs.

As shown in FIGS. 1J-1M, dipole concentrations D1-D6 in dipole layers 131N1-131N3 and 131P1-131P3 can be proportional to EWF values E1-E6 and threshold voltages V1-V6 of NFETs 102N1-102N3 and PFETs 102P1-102P3. Thus, controlling the dopant concentrations near and/or at HKN1-ION1 and HKN2-ION2 interfaces can adjust EWF values E1-E2 and absolute values of threshold voltages V1-V2. Similarly, controlling the dopant concentrations near and/or at HKP1-IOP1 and HKP2-IOP2 interfaces can adjust EWF values E4-E5 and absolute values of threshold voltages V4-V5.

Referring to FIGS. 1B-1C, first dopant control layers 129 can be configured to control the dopant concentration profiles across HK gate dielectric layers 128N1 and 128P1 and across HKN1-ION1 and HKP1-IOP1 interfaces and in interfacial oxide layers 127N1 and 127P1. Second dopant control layers 130 can be configured to control the dopant concentration profiles across HK gate dielectric layers 128N2 and 128P2 and across HKN2-ION2 and HKP2-IOP2 interfaces and in interfacial oxide layers 127N2 and 127P2. The discussion of first and second dopant control layers 129-130 applies to both NFETs and PFETs, unless mentioned otherwise. In some embodiments, first and second dopant control layers 129-130 can include Si and based on the concentration of Si in each of first and second dopant control layers 129-130, the dopant concentration profiles across HK gate dielectric layers 128N1-128N2 and across HKN1-ION1 and HKN2-ION2 interfaces and across interfacial oxide layers 127N1-127N2 can be adjusted.

Figure 1N:
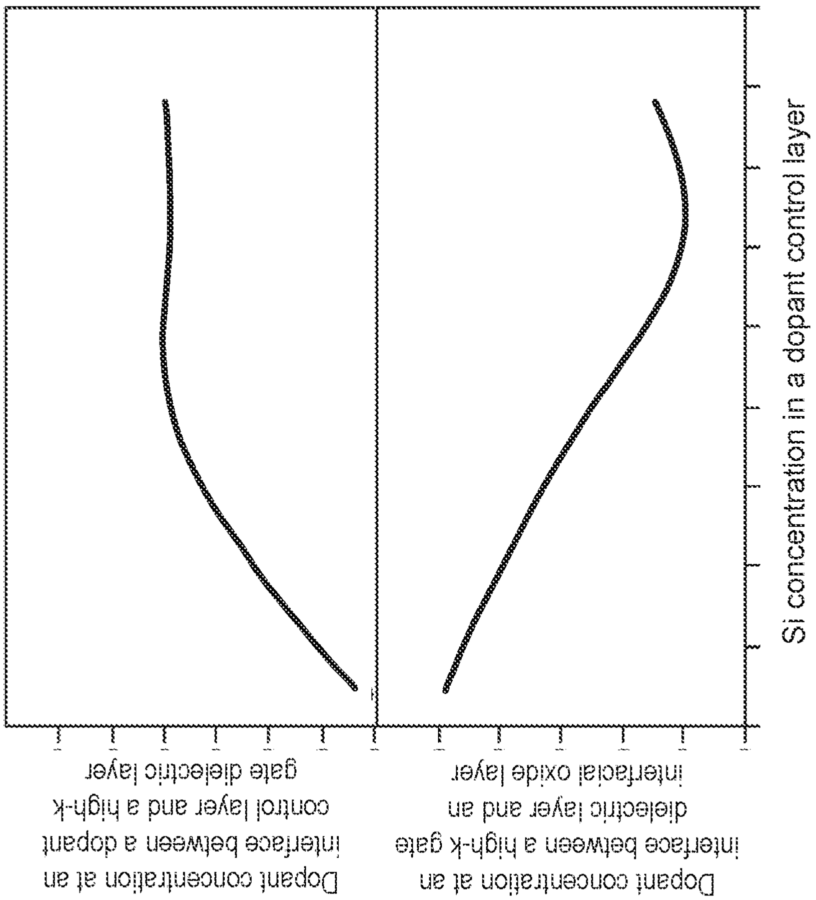
Figure 10:
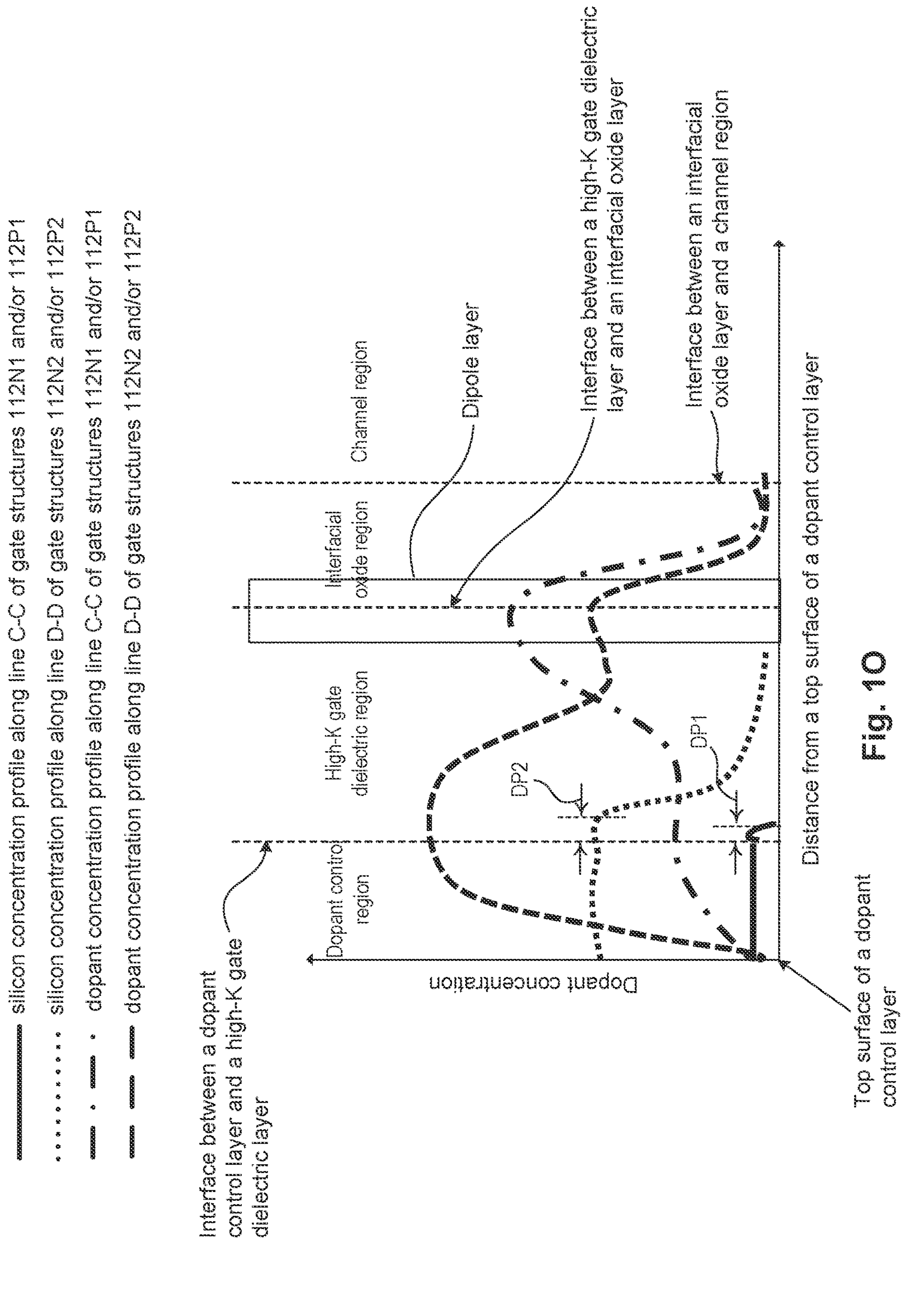
FIGS. 3A-6B, 7A-7F, and 8A-12B illustrate cross-sectional views of a semiconductor device with different gate structures at various stages of its fabrication process, in accordance with some embodiments.

As shown in FIG. 1N, decreasing Si concentration in first dopant control layer 129 can increase the dopant concentration at the HKN1-ION1 interface or in the top portion of interfacial oxide layer and can decrease the dopant concentration between HK gate dielectric layer 128N1 and first dopant control layer 129 or across the HK gate dielectric layer 128N1. Similarly, decreasing Si concentration in second dopant control layer 130 can increase the dopant concentration at HKN2-ION2 interface or in the top portion of interfacial oxide layer and can decrease the dopant concentration between HK gate dielectric layer 128N2 and second dopant control layer 130 or across the HK gate dielectric layer 128N2. In some embodiments, increasing or decreasing the Si concentration in first control layer 129 with respect to the Si concentration in IO layer 127N1 can decrease or increase the dopant concentration across the HKN1-ION1 interface because of the chemical affinity between Si and dopants of HK gate dielectric layer 128N1. Similarly, the dopant concentration across the HKN2-ION2 interface can be increased or decreased by decreasing or increasing the Si concentration in second control layer 130 with respect to the Si concentration in IO layer 127N2.

Thus, the dopant concentration profiles of each NFET and/or PFET can be adjusted independently of each other by varying the Si concentration in first and second dopant control layers 129-130. Referring to FIG. 1O, the dopant concentration profiles along lines C-C and D-D of FIGS. 1B-1C can be different from each other by having Si concentrations in first and second dopant control layers 129-130 different from each other. In some embodiments, first dopant control layer 129 has a lower Si concentration than second dopant control layer 130. As a result, dopant concentration is higher at the HKN1-ION1 interface than at HKN2-ION2 interface as shown in FIG. 1O. The dopant concentration profiles of FIG. 1O can be achieved with each HK gate dielectric layers 128N1-128N2 and/or 128P1-128P2 doped with a total amount of dopants (or a dopant dosage) similar to each other before the deposition of first and second dopant control layers 129-130. That is, the dopant concentration profiles in the gate structures 112N1 and in the gate structure 112N2 are similar to each other (not shown) before the deposition of first and second dopant control layers 129-130. In some embodiments, Si of first and second dopant control layers 129-130 can diffuse depths DP1-DP2 into HK gate dielectric layers 128N1-128N2, respectively, as shown in FIG. 1O. In some embodiments, depth DP1 can range from about 0.01 nm to about 0.3 nm, and depth DP2 can range from about 0.8 nm to about 1.5 nm. In some embodiments, Si concentration within depth DP1 can range from about 0 atomic % to about 5 atomic % and Si concentration within depth DP2 can range from about 5 atomic % to about 30 atomic % with respect to other elements in HK gate dielectric layers 128N1-128N2.

In some embodiments, first dopant control layer 129 can have titanium silicon nitride (TiSiN) with about 0 atomic % (e.g., TiN) to about 30 atomic % of Si with respect to Ti, and second dopant control layer 130 can have TiSiN with about 30 atomic % to about 100 atomic % (e.g., SiN, or pure Si) of Si with respect to Ti. In some embodiments, second dopant control layer 130 can have a Si to metal atomic concentration ratio greater than a Si to metal atomic concentration ratio of first dopant control layer 129. In some embodiments, a ratio of Si concentration in second control layer 130 to Si concentration in IO layer 127N2 is greater than a ratio of Si concentration in first control layer 129 to Si concentration in TO layer 127N1.

Figure 1P:
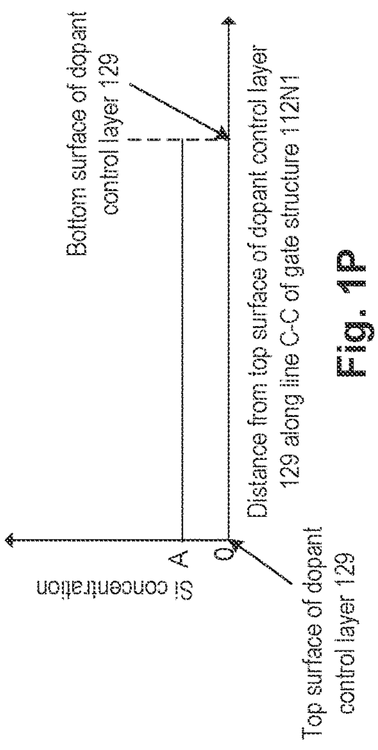
Figure 1Q:
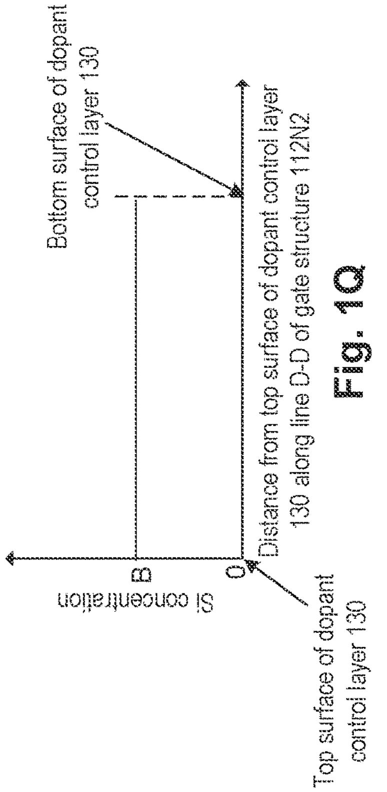
Figure 1R:
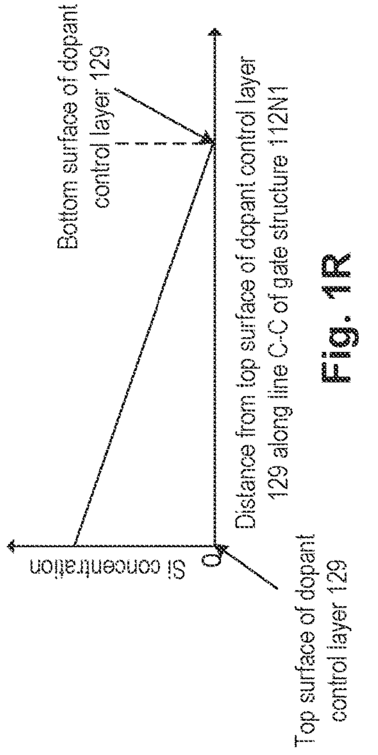
Figure 1S:
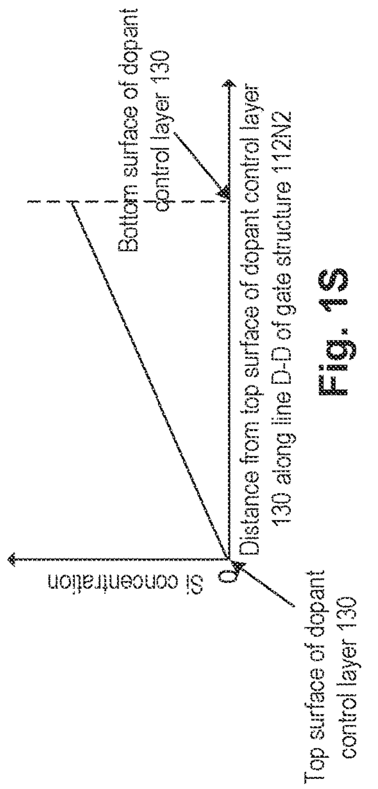
Figure 1T:
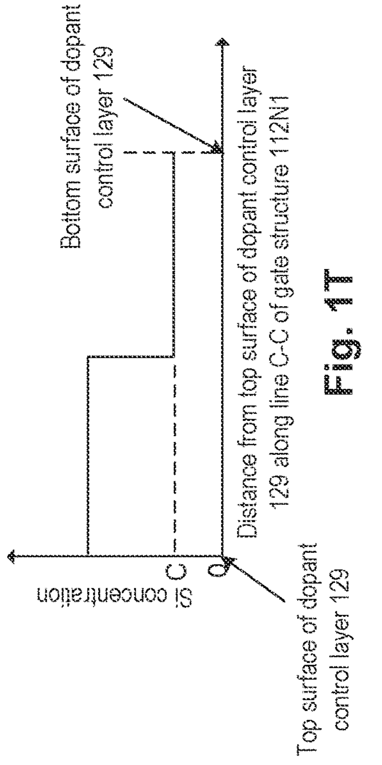
Figure 1U:
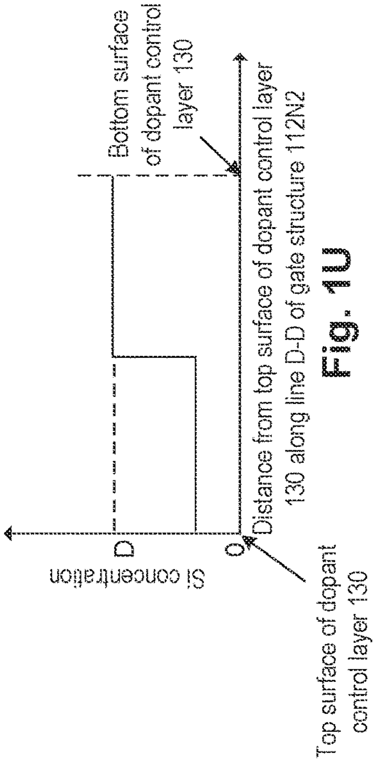

In some embodiments, first and second dopant control layers 129 and 130 can have substantially constant Si concentrations A and B along lines C-C and D-D as shown in FIGS. 1P and 1Q, respectively, where concentration A is lower than concentration B. In some embodiments, first and second dopant control layers 129 and 130 can have graded Si concentration profiles along lines C-C and D-D as shown in FIGS. 1P and 1Q, respectively. In some embodiments, first and second dopant control layers 129 and 130 can have step-shaped Si concentration profiles along lines C-C and D-D as shown in FIGS. 1T and 1U, respectively, where a top portion of first dopant control layer 129 has a higher Si concentration than its bottom portion and a top portion of second dopant control layer 130 has a lower Si concentration than its bottom portion. Si concentration C of bottom portion of first dopant control layer 129 can be lower than Si concentration D of bottom portion of second dopant control layer 130 as shown in FIGS. 1T-1U. In some embodiments, first and/or second dopant control layers 129-130 can have TiSiN, Si, $SiO_2$, silicon titanium (SiTi), Ge, SiGe, tantalum silicide ($TaSi_2$), titanium silicide ($TiSi_2$), nickel silicide (NiSi), tungsten silicide ($WSi_2$), molybdenum silicide ($MoSi_2$), or a combination thereof.

In some embodiments, HK gate dielectric layers 128N1-128N2 can be doped with a total amount of dopants (or a dopant dosage) different from each other, and a dopant control layer 133 can be used to achieve different dipole concentrations in dipole layers 131N1-131N2 as shown in FIG. 1F, which is a portion 100A of the structure of FIG. 1B. In some embodiments, dopant control layer 133 can be similar to first or second dopant control layers 129-130. In some embodiments, first and second dopant control layers 129-130 can be removed from gate structures 112N1-112N3 to form the structures of FIG. 1G after desired dopant concentration profiles are achieved across the HKN1-ION1 and HKN2-ION2 interfaces. FIG. 1G shows a portion 100A of the structure of FIG. 1B with first and second dopant control layers 129-130 removed. Also, FIG. 1G shows gate structures 112N1-112N2 can be formed without WFM layers 132N when threshold voltages of NFETs and PFETs can be adjusted with dopant control layers, such as dopant control layers 129-130. In some embodiments, gate structures 112N1-112N2 of FIG. 1B can be formed without WFM layers 132N similar to gate structures 112N1-112N2 of FIG. 1G. The dopant concentration profiles along lines C*-C* and D*-D* of FIG. 1G can be similar to the dopant concentration profiles shown in FIG. 1O within the HK gate dielectric region and IO region.

Figure 1V:
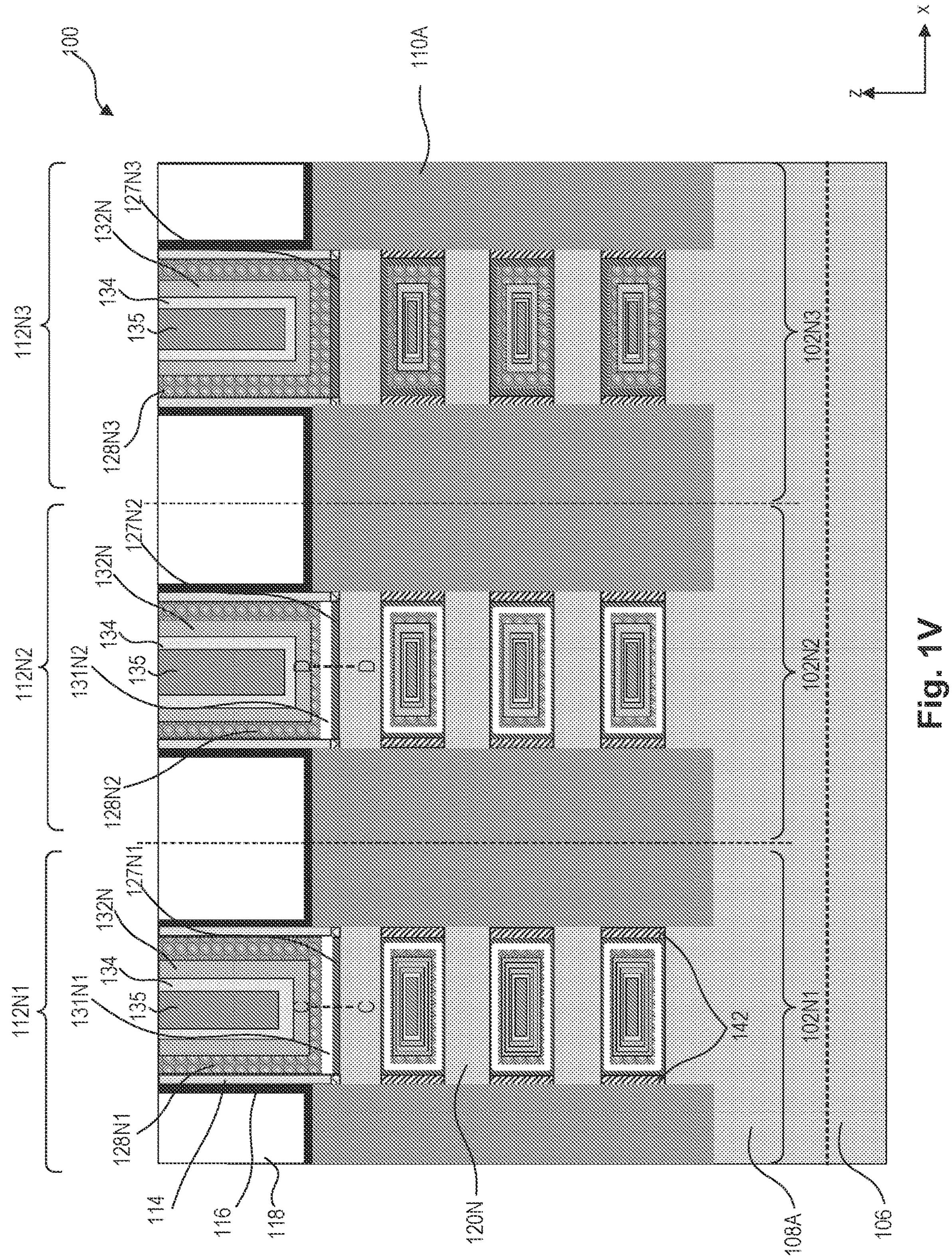
Figure 1W:
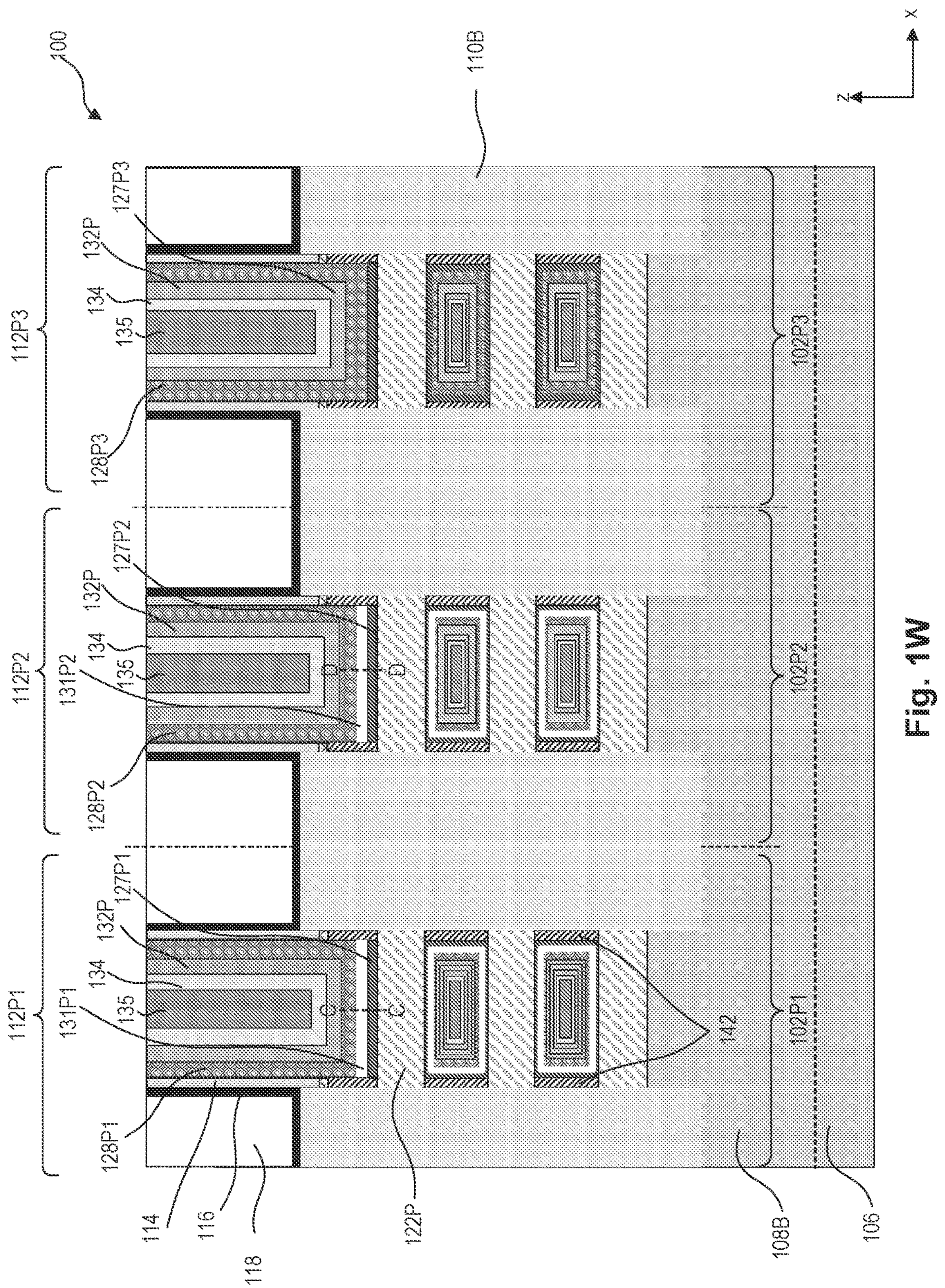

In some embodiments, HK gate dielectric layers 128N1-128N2 and 128P1-128P2 can be initially doped with a total amount of dopants (or a dopant dosage) similar to each other, and subsequently different dopant control layers 129-130 can be used to achieve different dipole concentrations in dipole layers 131N1-131N2 and 131P1-131P2. In some embodiments, first and second dopant control layers 129-130 can be removed from gate structures 112N1-112N3 and 112P1-112P3 to form the structures of FIGS. 1V-1W after desired dopant concentration profiles are achieved across the HKN1-ION1, HKN2-ION2, HKP1-IOP1, and HKP2-IOP2 interfaces. FIGS. 1V-1W show the structures of FIGS. 1B-1C with first and second dopant control layers 129-130 removed. The dopant concentration profiles along lines C-C and D-D of FIGS. 1V-1W can be similar to the dopant concentration profiles shown in FIG. 1O within the HK gate dielectric region and IO region. In some embodiments, gate structures 112N1-112N2 and 112P1-112P2 can be formed with WFM layers 132N-132P when threshold voltages of NFETs and PFETs needs to be further adjusted with dopant control layers, such as dopant control layers 129-130, together with WFM layers 132N-132P.

In some embodiments, NFETs 102N1-102N4 can have gate structures **112N1*-112N4* with cross-sectional views (along line A-A of FIG. 1A) as shown in FIG. 1H. The discussion of gate structure 112N1-112N2 applies to respective gate structures 112N4*-112N3*, unless mentioned otherwise. The discussion of HK gate dielectric layer 128N1-128N2 applies to respective HK gate dielectric layer 128N1*-128N2* and the discussion of dipole layer 131N1-131N2 applies to respective dipole layers 131N1*-131N2*, unless mentioned otherwise. Each gate structures 112N4* and 112N2* have a total amount of dopants greater than a total amount of dopants of gate structures 112N1*** and 112N3*, respectively. Dipole concentrations in dipole layers 131N1* and 131N2 are greater than dipole concentrations in dipole layers 131N1 and 131N2*, respectively. In some embodiments, PFETs 102P1-102P4 can have gate structures 112P1*-112P4* with cross-sectional views (along line B-B of FIG. 1A) as shown in FIG. 1I. The discussion of gate structure 112P1-112P2 applies to respective gate structures 112P4*-112P3*, unless mentioned otherwise. The discussion of HK gate dielectric layer 128N1*-128N2* and dipole layers 131N1*-131N2* applies to HK gate dielectric layer 128P1*-128P2* and dipole layers 131P1*-131P2*, respectively.

Referring back to FIG. 1B-1E, in some embodiments, WFM layers 132N can include titanium aluminum (TiAl), titanium aluminum carbide (TiAlC), tantalum aluminum (TaAl), tantalum aluminum carbide (TaAlC), or a combination thereof and WFM layers 132P can include substantially Ti-based nitrides or alloys, such as TiN, TiSiN, WN, WCN, Ru, W, Mo and a combination thereof. A glue layer is often deposited after WFM layer 132N or 132P and before depositing FFW layer 134. The glue layer can include TiN, Ti, Co or a combination thereof. FFW layers 134 can prevent any substantial diffusion of fluorine (e.g., no fluorine diffusion) from fluorine-based precursors used during the deposition of overlying gate metal fill layers 135 to underlying layers. FFW layers 134 can include substantially fluorine-free tungsten layers. In some embodiments, FFW layer can be absent or not deposited at all. Gate metal fill layers 135 can include a suitable conductive material, such as W, Ti, silver (Ag), ruthenium (Ru), molybdenum (Mo), copper (Cu), cobalt (Co), Al, iridium (Ir), nickel (Ni), metal alloys, and a combination thereof. Gate spacers 114 and inner spacers 142 can form sidewalls of gate structures 112N1-112N3 and 112P1-112P3. Each of gate spacers 114 and inner spacer 142 can include insulating material, such as silicon oxide, silicon nitride, silicon oxynitride, a low-k material, and a combination thereof.

Semiconductor device 100 can further include isolation structure 104, etch stop layer (ESL) 116, interlayer dielectric (ILD) layer 118, and shallow trench isolation (STI) regions 138. Isolation structure 104 can electrically isolate NFETs 102N1-102N3 and PFETs 102P1-102P3 from each other. ESL 116 can be configured to protect gate structures 112N1-112N3 and 112P1-112P3 and/or S/D regions 110A-110B. In some embodiments, isolation structure 104 and ESL 116 can include an insulating material, such as silicon oxide and silicon germanium oxide. ILD layer 118 can be disposed on ESL 116 and can include a dielectric material. STI regions 138 can be configured to provide electrical isolation between NFETs 102N1-102N3 and PFETs 102P1-102P3 and can include an insulating material.

The cross-sectional shapes of semiconductor device 100 and its elements (e.g., fin structure $108_1$-$108_2$, gate structures 112N1-112N3 and 112P1-112P3, epitaxial fin regions 110A-110B, inner spacers 142, gate spacers 114, and/or STI regions 138) are illustrative and are not intended to be limiting.

Figure 2:
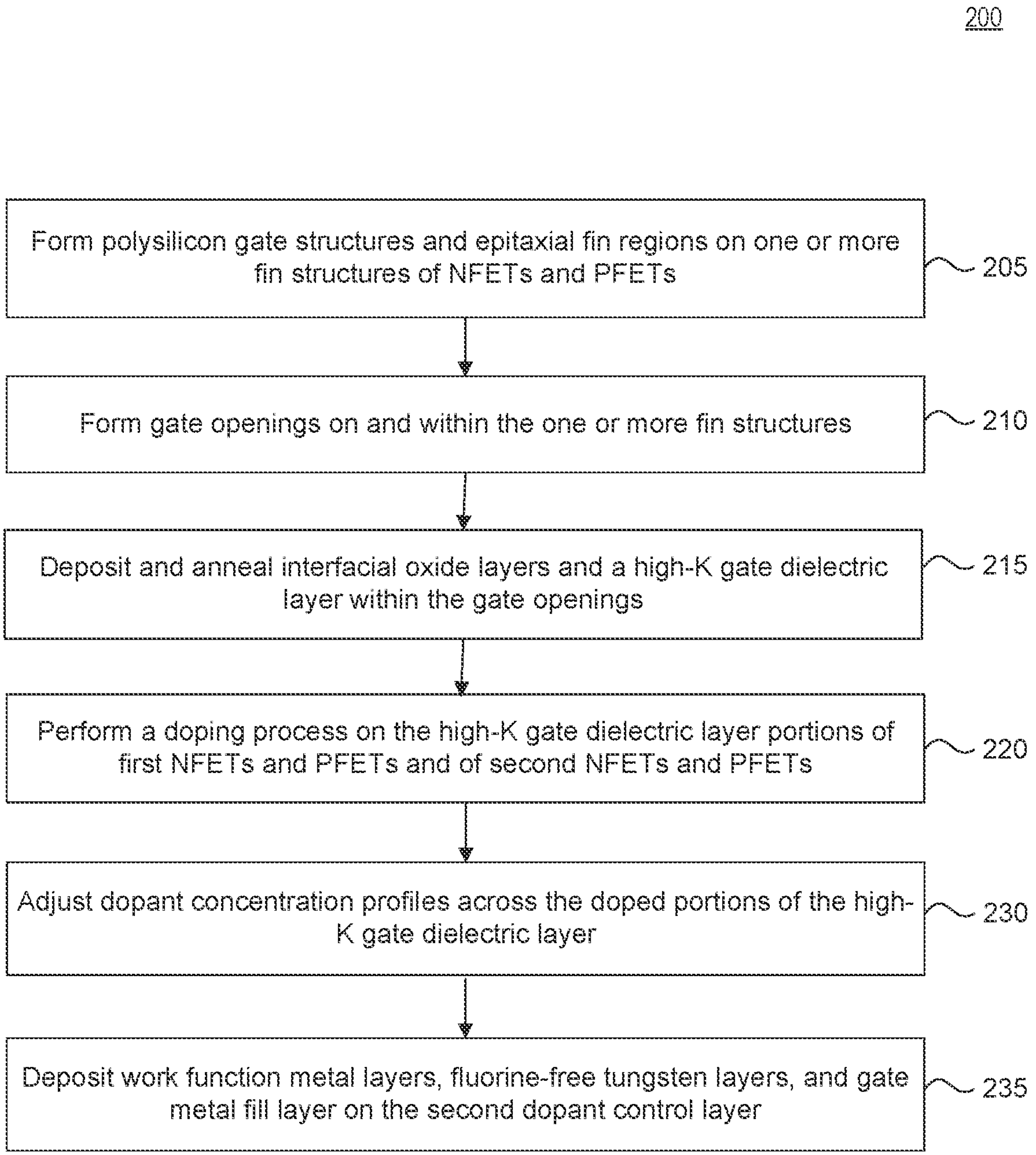
FIG. 2 is a flow diagram of a method for fabricating a semiconductor device with different gate structures, in accordance with some embodiments.
Figure 5A:
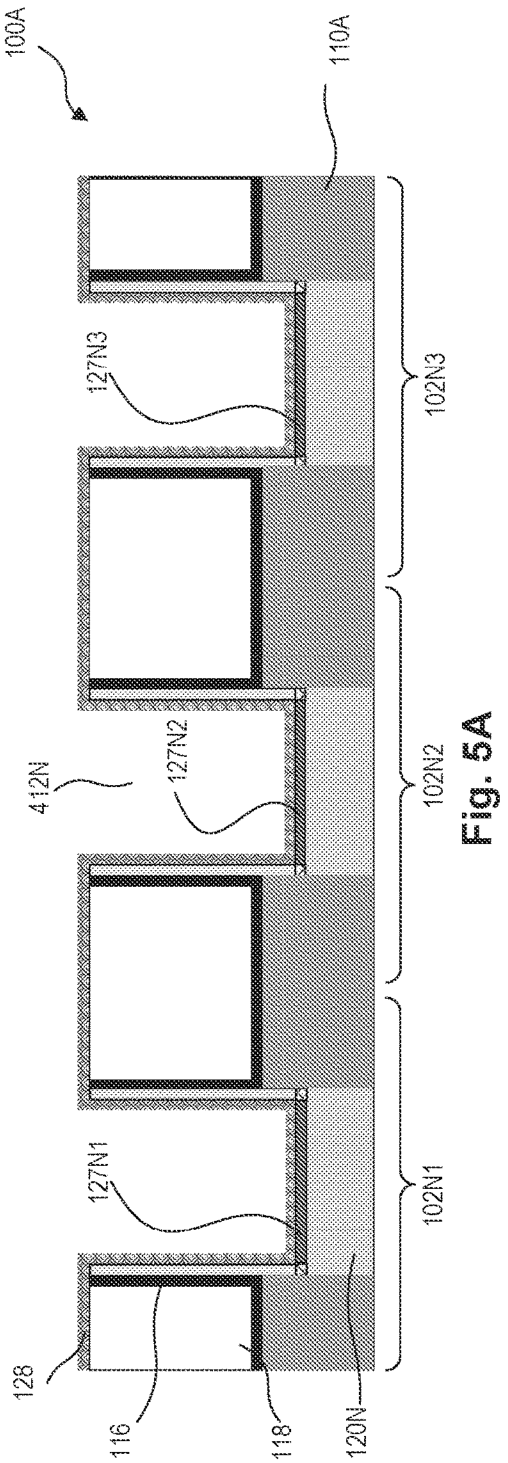
Figure 5B:
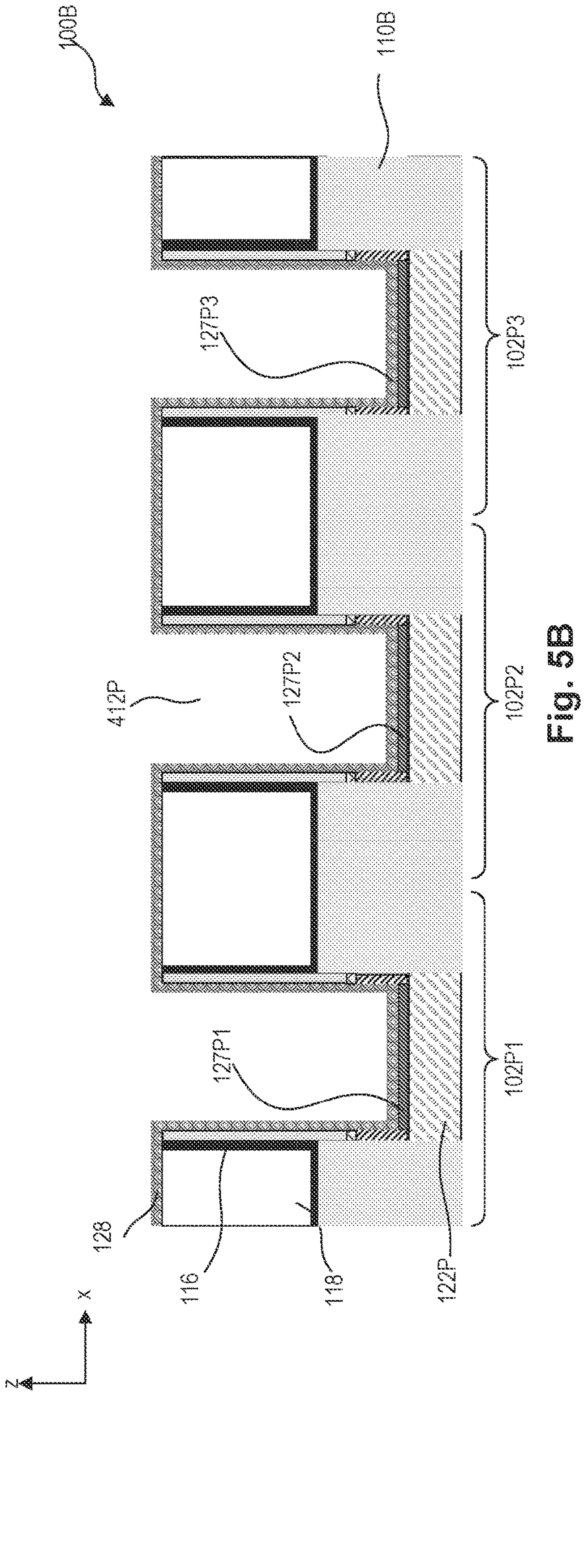
Figure 6A:
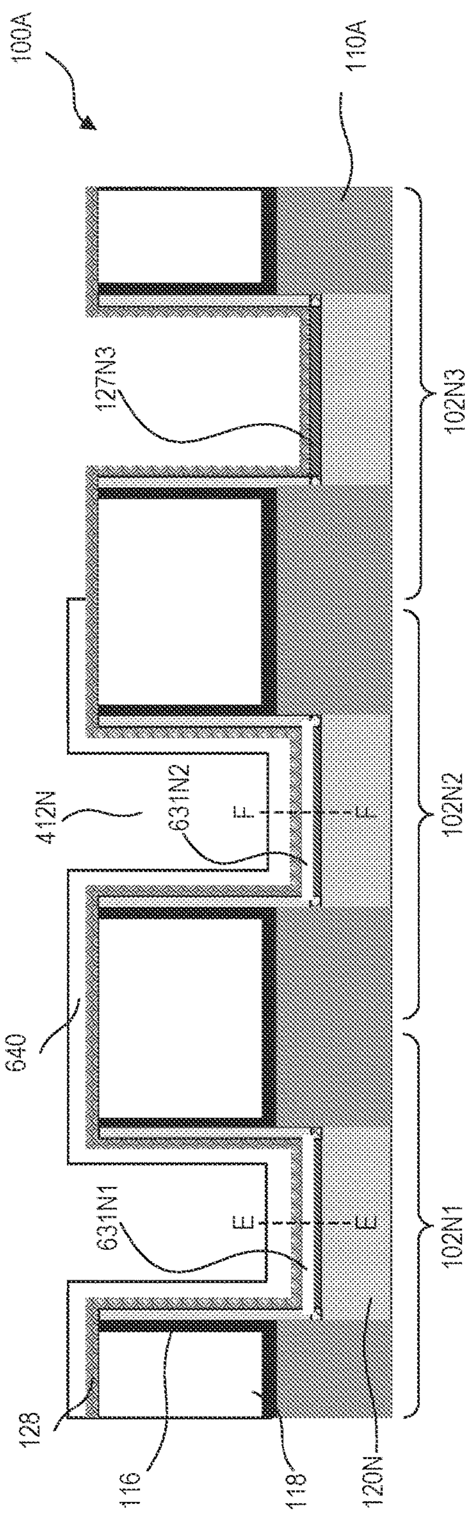
FIGS. 6C and 11C-11E illustrate device characteristics of a semiconductor device with different gate structures at various stages of its fabrication process, in accordance with some embodiments.
Figure 6B:
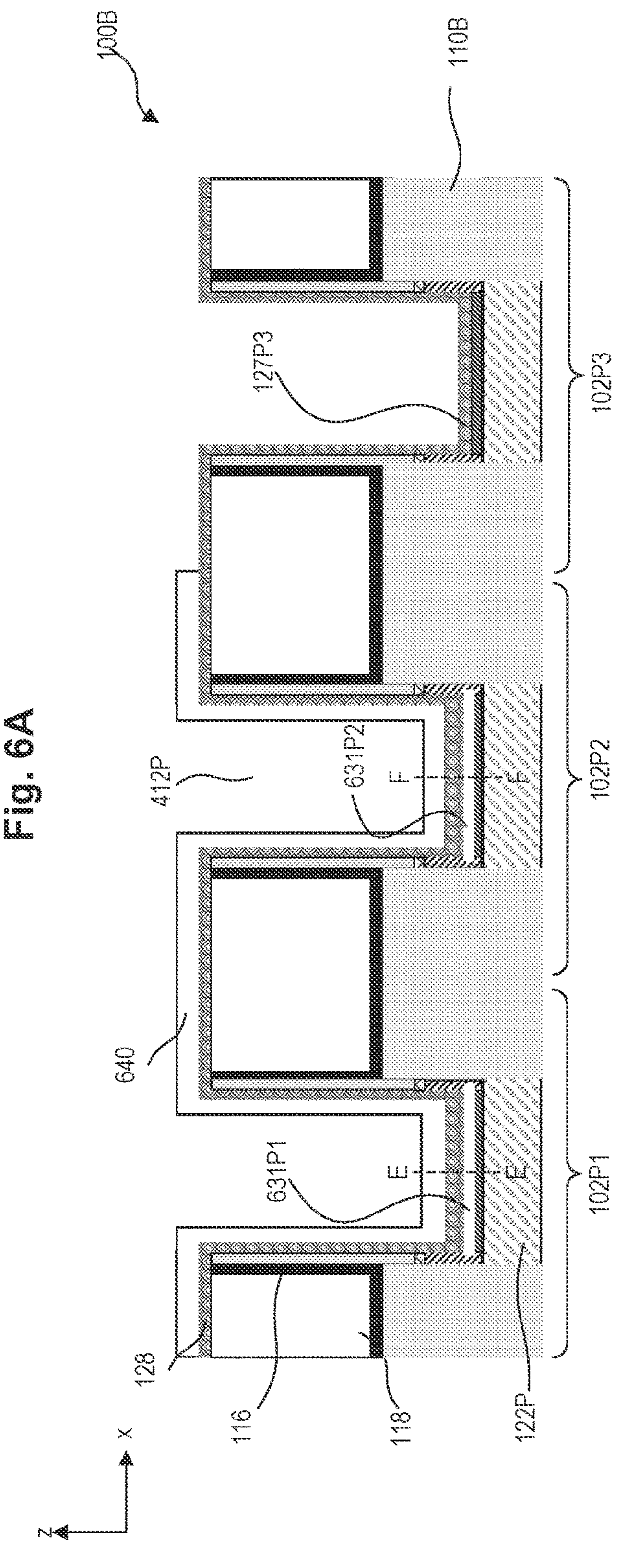
Figure 6C:
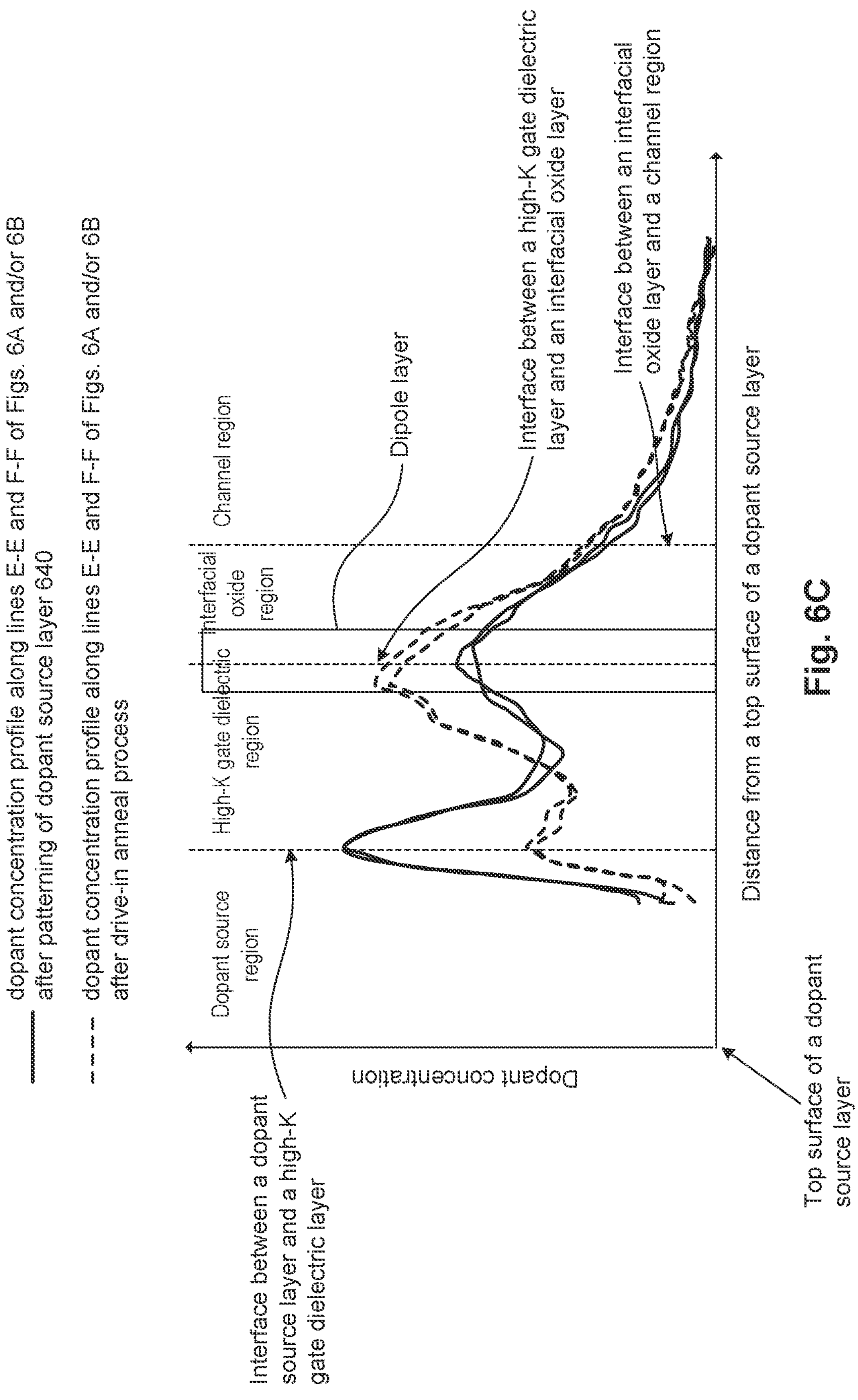
Figure 11A:
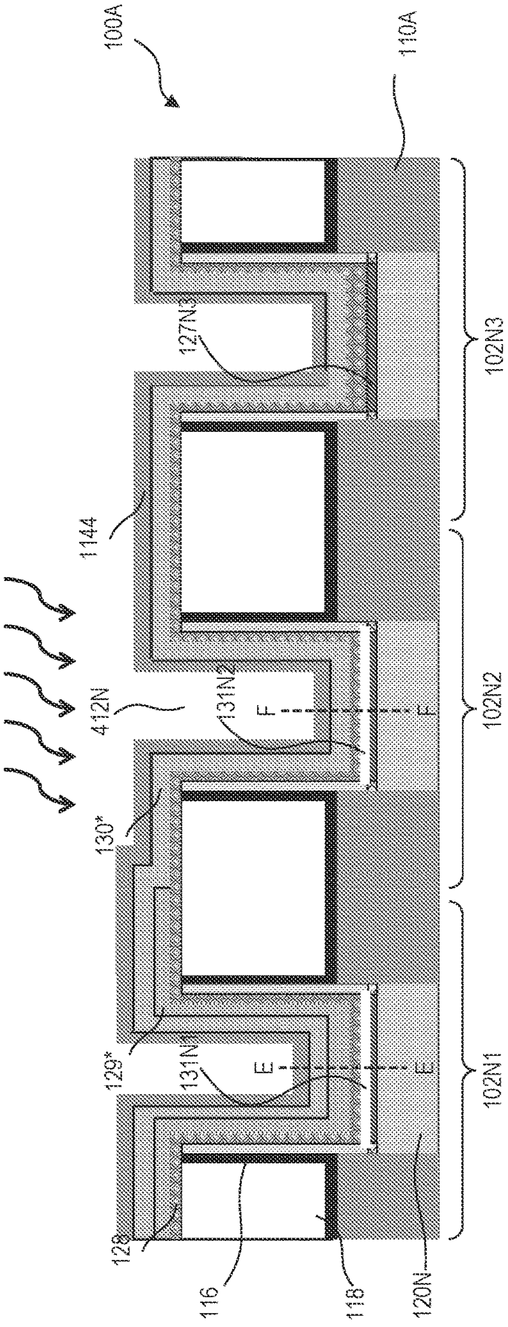
Figure 11B:
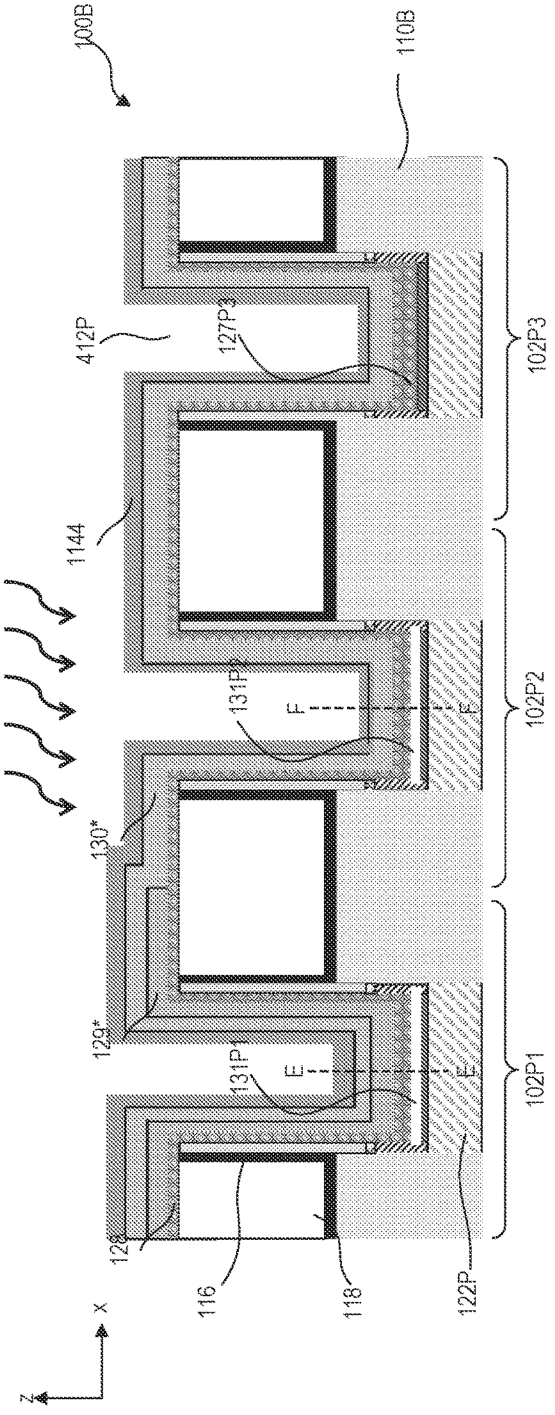
Figure 11C:
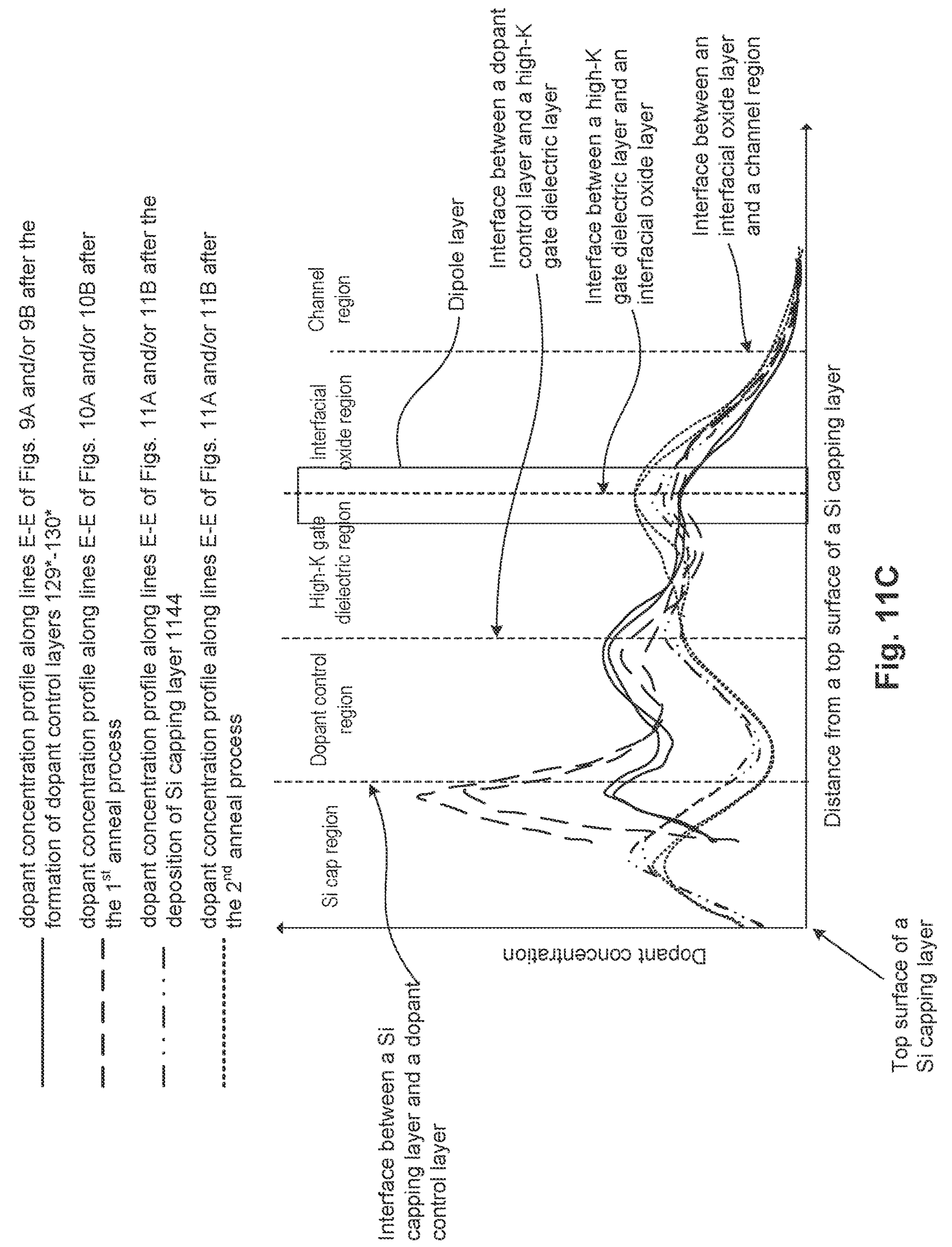
Figure 11D:
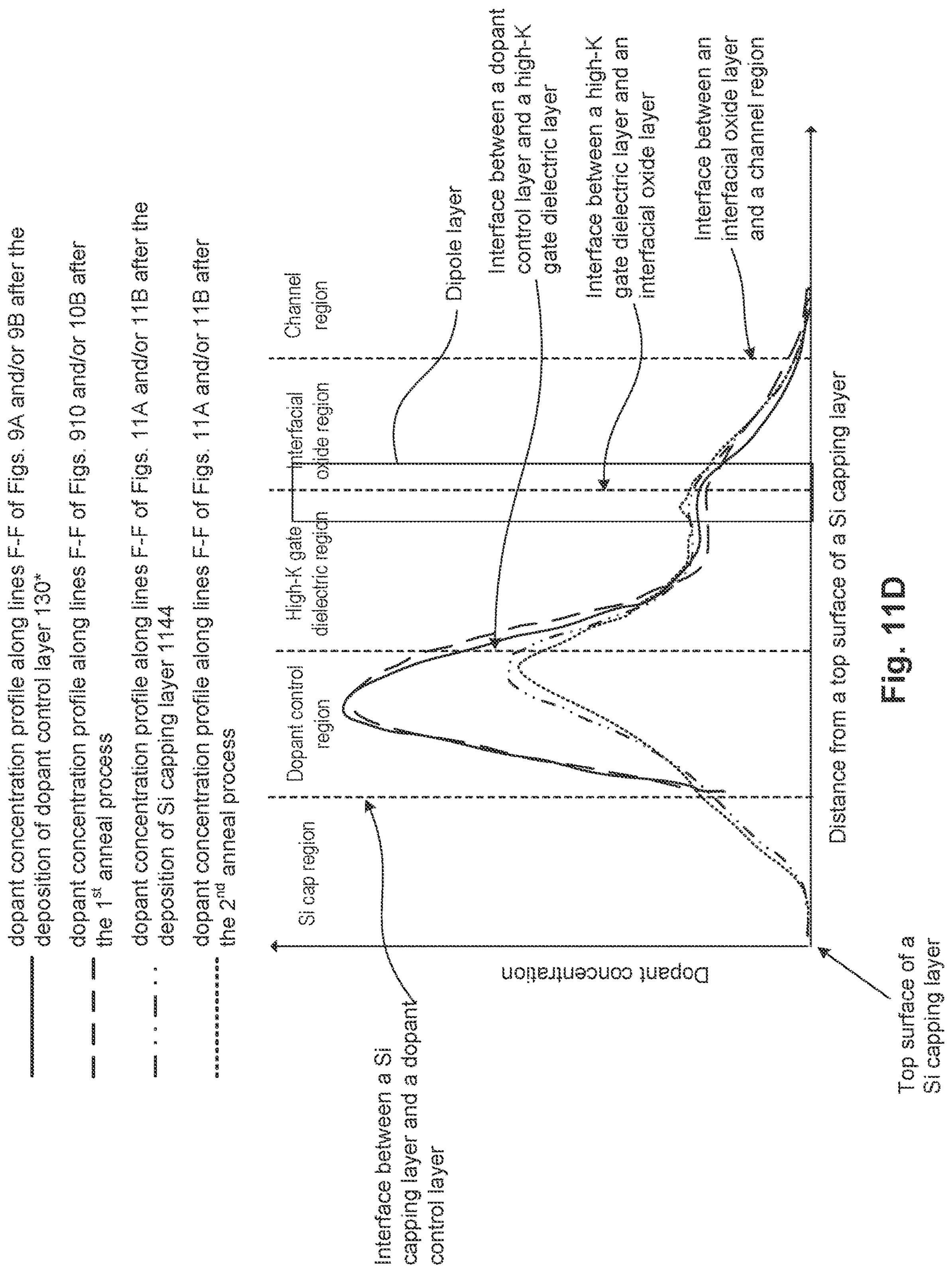

FIG. 2 is a flow diagram of an example method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3A-12B. FIGS. 3A-12B are cross-sectional views along lines A-A and B-B of semiconductor device 100 at various stages of fabrication, according to some embodiments. FIGS. 6C and 11C-11D illustrate dopant concentration profiles along lines E-E and F-F of semiconductor device 100 at various stages of its fabrication process, in accordance with some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Elements in FIGS. 3A-12B with the same annotations as elements in FIGS. 1A-1I are described above.

Figure 3B:
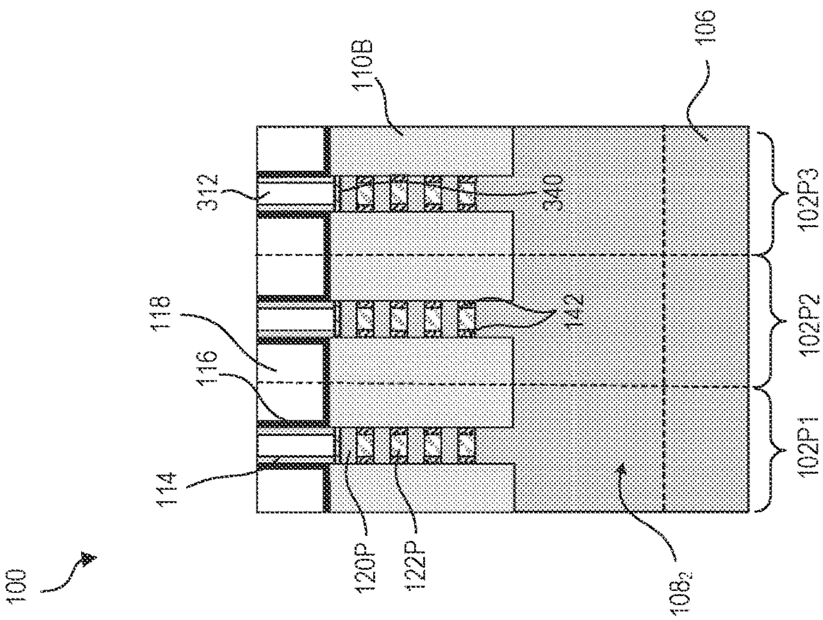
Figure 3A:
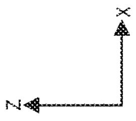
Figure 3A:
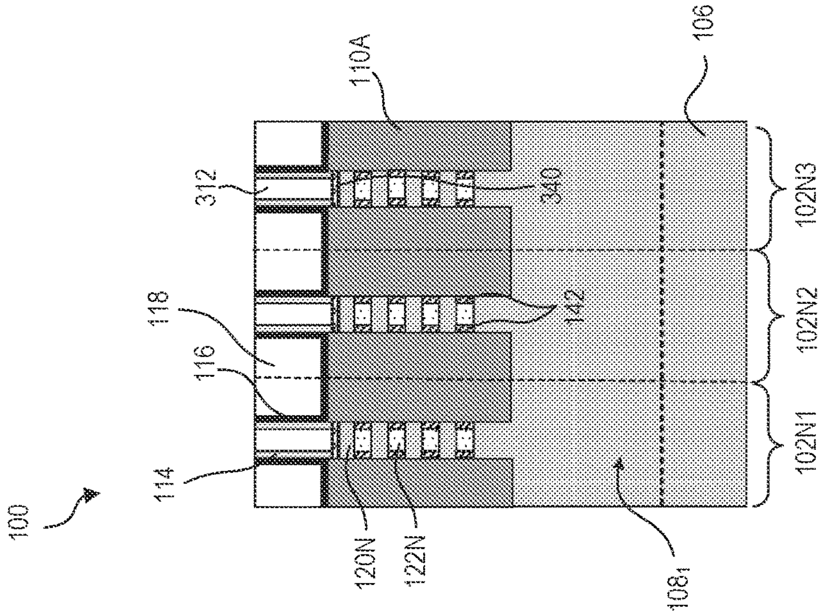

In operation 205, polysilicon structures and epitaxial fin regions are formed on fin structures of NFETs and PFETs. For example, as shown in FIGS. 3A-3B, polysilicon structures 312 can be formed on fin structures $108_1$-$108_2$ and gate spacers 114 can be formed on sidewalls of polysilicon structures 312. During subsequent processing, polysilicon structures 312 can be replaced in a gate replacement process to form gate structures 112N1-112N3 and 112P1-112P3. Following the formation of gate spacers 114, n- and p-type epitaxial fin regions 110A-110B can be selectively formed on portions of fin structures $108_1$-$108_2$ that are not underlying polysilicon structures 312. After the formation of epitaxial fin regions 110A-110B, ESL 116 and ILD 118 can be formed to form the structures of FIGS. 3A-3B.

Figure 4B:
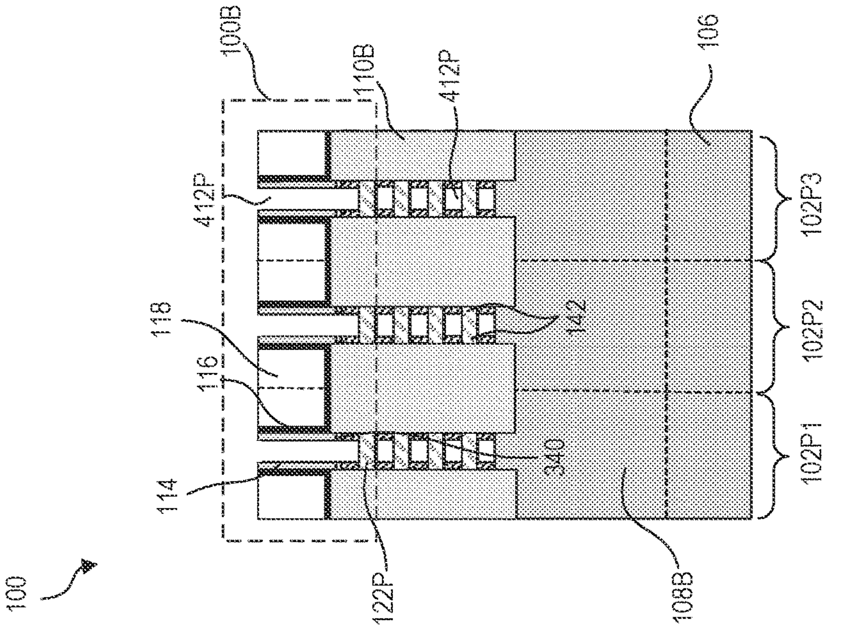
Figure 4A:
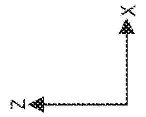
Figure 4A:
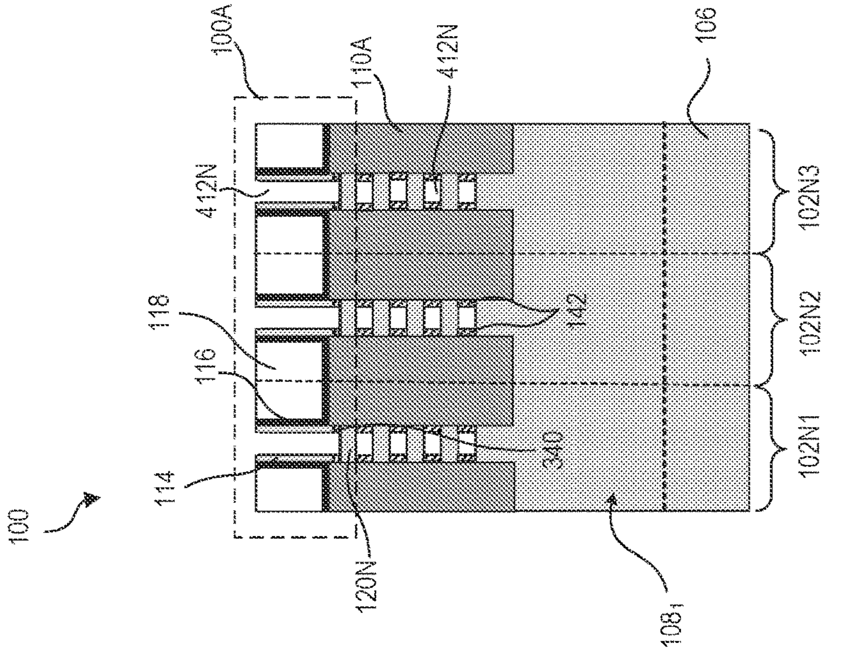

Referring to FIG. 2, in operation 210, gate openings are formed on and within the one or more fin structures. For example, as shown in FIGS. 4A-4B, gate openings 412N-412P associated with NFETs 102N1-102N3 and PFETs 102P1-102P3, respectively, can be formed on and within fin structures $108_1$-$108_2$. The formation of gate openings 412N can include sequential operations of (i) etching polysilicon structures 312 from the structures of FIGS. 3A-3B, and (ii) etching nanostructured regions 122N and 120P from the structures of FIGS. 3A-3B.

Referring to FIG. 2, in operations 215-235, gate-all-around (GAA) structures are formed in the gate openings. For example, based on operations 215-235, gate structures 112N1-112N3 and 112P1-112P3 can be wrapped around nanostructured channel regions 120N and 122P, as described with reference to FIGS. 5A-12B.

In operation 215, interfacial oxide layers and an HK gate dielectric layer are deposited and annealed within the gate openings. For example, as shown in FIGS. 5A-5B, interfacial oxide layers 127N1-127N3 and 127P1-127P3 and a HK gate dielectric layer 128 can be deposited and annealed on nanostructured channel regions 120N and 122P within gate openings 412N-412P of FIGS. 4A-4B. During subsequent processing, HK gate dielectric layer 128 can form HK gate dielectric layers 128N1-128N3 and 128P1-138P3 of FIGS. 1A-1E. FIGS. 5A-5B show portions 100A-100B of the structures of FIGS. 4A-4B, respectively, for the sake of clarity.

Interfacial oxide layers 127N1-127N3 and 127P1-127P3 can be formed on exposed surfaces of nanostructured channel regions 120N and 122P within gate openings 412N-412P. In some embodiments, interfacial oxide layers 127 can be formed by exposing nanostructured channel regions 120N and 122P to an oxidizing ambient. The oxidizing ambient can include a combination of ozone ($O_3$), a mixture of ammonia hydroxide, hydrogen peroxide, and water ("SC1 solution"), and/or a mixture of hydrochloric acid, hydrogen peroxide, water ("SC2 solution").

The deposition of HK gate dielectric layer 128 can include blanket depositing HK gate dielectric layer 128 on the partial semiconductor device 100 (not shown) formed after the formation of interfacial oxide layers 127. The blanket deposited HK gate dielectric layer 128 can be substantially conformally deposited on interfacial oxide layers 127 and the exposed surfaces of the partial semiconductor device 100 as shown in FIGS. 5A-5B. In some embodiments, HK gate dielectric layer 128 can be formed with ALD using hafnium chloride ($HfCl_4$) as a precursor at a temperature ranging from about 250° C. to about 350° C. In some embodiments, gate dielectric layer 128 can have a thickness ranging from about 1 nm to about 3 nm in order to wrap around nanostructures channel regions 120N and 122P without being constrained by spacing between adjacent nanostructured channel regions 120N and between adjacent nanostructured channel regions 122P.

Referring to FIG. 2, in operation 220, a doping process is selectively performed on the HK gate dielectric layer portions of the first NFETs and PFETs and second NFETs and PFETs. For example, as shown in FIGS. 6A-6B, portions of HK gate dielectric layer 128 of NFETs 102N1-102N2 and PFETs 102P1-102P2 can be doped with metal dopants that induces the formation of dipole layers 631N1-631N2 and 631P1-631P2. During subsequent processing, dipole layers 631N1-631N2 and 631P1-631P2 can form dipole layers 131N1-131N2 and 131P1-131P2 of FIGS. 1A-1E. The doping process can include sequential operations of (i) blanket depositing a dopant source layer (not shown) on the structures of FIGS. 5A-5B, (ii) patterning the dopant source layer to form patterned dopant source layer 640 as shown in FIGS. 6A-6B, (iii) performing a drive-in anneal process on the structures of FIGS. 6A-6B, and (iv) removing dopant source layer 640. This doping process can dope the portions of HK gate dielectric layer 128 in 102N1, 102N2, and in 102P1, 102P2 as shown in FIG. 6A-6B with a similar amount of dopants because the same dopant source layer is used. It should be noted that, at this stage the dopant concentration profiles across lines E-E and F-F in 112N1-112N2 and 112P1-112P2 are similar to each other.

The blanket deposition of the dopant source layer can include blanket depositing about 0.05 nm to about 2 nm thick dopant source layer on HK gate dielectric layer 128 with an ALD or a CVD process. The dopant source layer can include (i) an oxide of rare-earth metals, such as Lanthanum oxide ($La_2O_3$), Yttrium oxide ($Y_2O_3$), Cerium oxide ($CeO_2$), Ytterbium oxide ($Yb_2O_3$), Erbium oxide ($Er_2O_3$), Scandium oxide ($Sc_2O_3$) and Lutetium oxide ($Lu_2O_3$); (ii) an oxide of a metal from group IIA (e.g., magnesium oxide (MgO) or strontium oxide (SrO)), group IIIA (e.g., aluminum oxide ($Al_2O_3$)), group IIIB (e.g., yttrium oxide ($Y_2O_3$)), or group IVB (e.g., zirconium oxide ($ZrO_2$) or titanium oxide ($TiO_2$)) of the periodic table; or (iii) a combination thereof. The patterning of the dopant source layer can include using lithography and etching processes that include acid-based (e.g., HCl-based) chemical etching or chemicals including HCl, $H_2O_2$, $NH_4OH$, HF, $H_3PO_4$, DI water or a combination thereof.

The drive-in anneal process can include annealing dopant source layer 640 at a temperature from about 550° C. to about 850° C. and at a pressure from about 1 torr to about 50 torr for a time period ranging from about 0.1 second to about 30 seconds. In some embodiments, the drive-in anneal process can include two anneal processes: (i) a soak anneal process at a temperature from about 550° C. to about 850° C. for a time period ranging from about 2 sec to about 60 sec and (ii) a spike anneal process at a temperature from about 700° C. to about 900° C. for a time period ranging from about 0.1 second to about 2 seconds. FIG. 6C shows dopant concentration profiles along lines E-E and F-F of FIGS. 6A-6B after patterning of dopant source layer 640 and after the drive-in anneal process. Following the drive-in anneal process, the dopant concentration increases at the HK-IO interfaces of NFETs 102N1-102N2 and PFETs 102P1-102P2 and can have graded profiles across dipole layers 631N1-631N2 and 631P1-631P2 as shown in FIG. 6C.

Figure 7A:
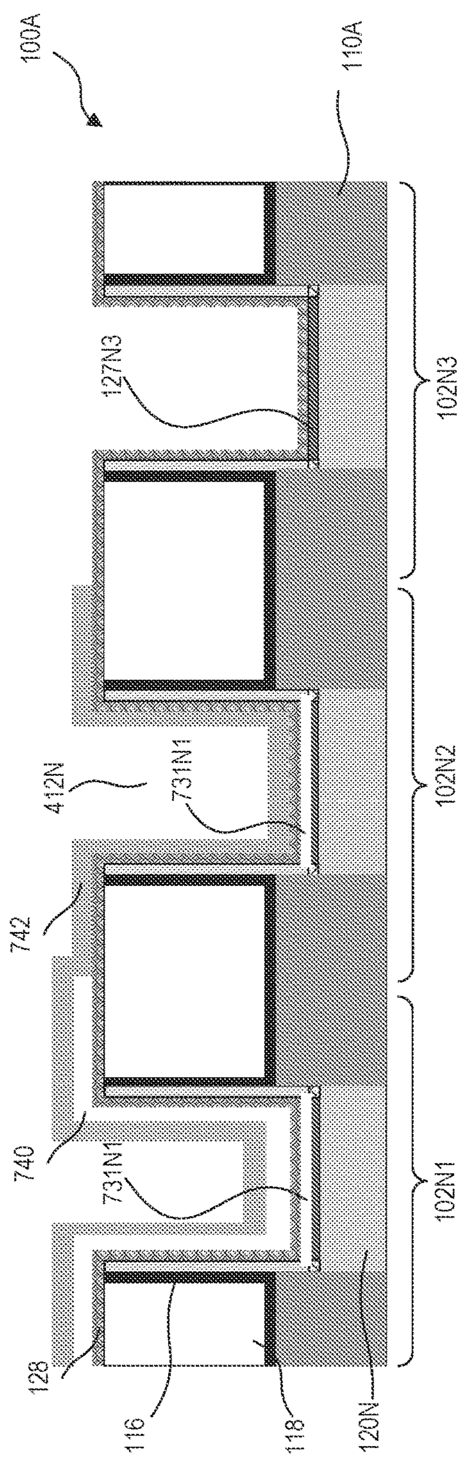
Figure 7B:
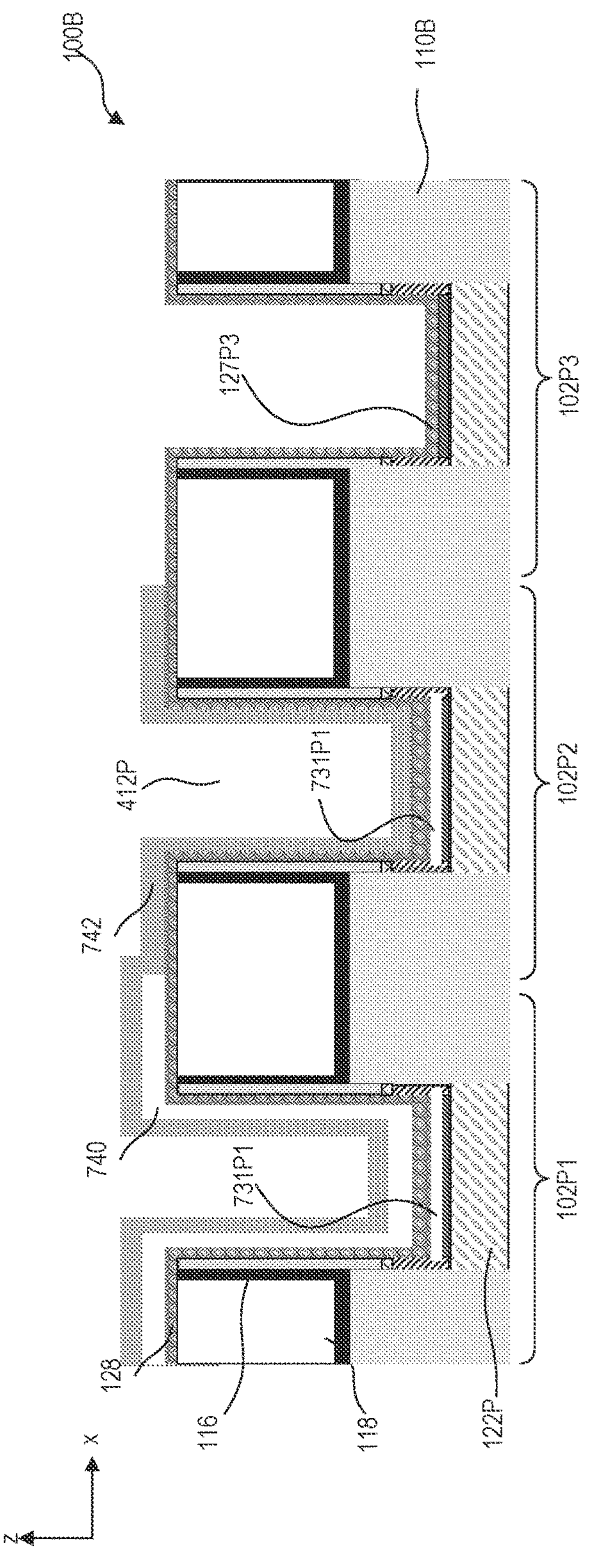

In some embodiments, instead of the doping process described with reference to FIGS. 6A-6B, portions of HK gate dielectric layer 128 of NFETs 102N1-102N2 and PFETs 102P1-102P2 can be doped with the process described with reference to FIGS. 7A-7B to dope the portions of HK gate dielectric layer 128 with different amount of dopants. The doping process can include sequential operations of (i) blanket depositing a first dopant source layer (not shown) on the structures of FIGS. 5A-5B, (ii) patterning the first dopant source layer to form a patterned first dopant source layer 740 as shown in FIGS. 7A-7B, (iii) blanket depositing a second dopant source layer (not shown) on the structures formed after the patterning of the first dopant source layer, (iv) patterning the second dopant source layer to form a patterned second dopant source layer 742 as shown in FIGS. 7A-7B, (iii) performing a drive-in anneal process on the structures of FIGS. 7A-7B, and (iv) removing first and second dopant source layers 740 and 742. Optionally, the doping process can be followed by deposition of a thin high-k dielectric layer similar to HK gate dielectric layer 128 on doped HK gate dielectric layer 128.

The first and second dopant source layers 740 and 742 can be similar to or different from each other in material composition and can include material similar to dopant source layer 640. The drive-in anneal process can be similar to that described with reference to FIGS. 6A-6B. Portions of HK gate dielectric layer 128 underlying the stack of first and second dopant source layers 740 and 742 can be doped with a larger amount of dopants than portions of HK gate dielectric layer underlying second dopant source layer 742. As a result, dipole layers 731N1-731P1 induced by the dopants from the stack of first and second dopant source layers 740 and 742 can have a higher dipole concentration than dipole layers 731N2-731P2 induced by the dopants from second dopant source layers 740.

Figure 7C:
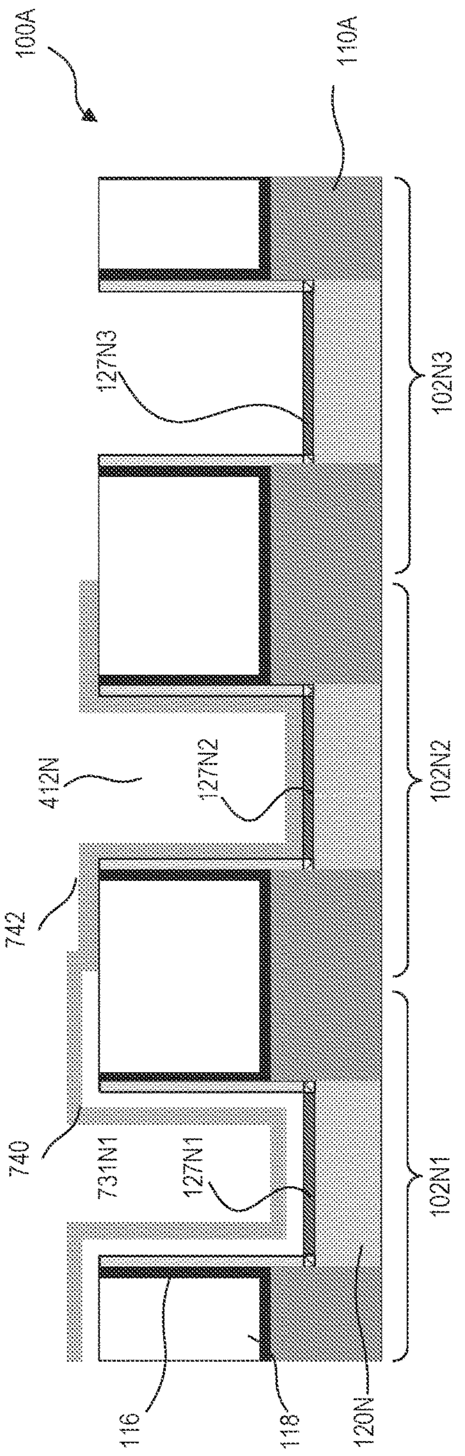
Figure 7D:
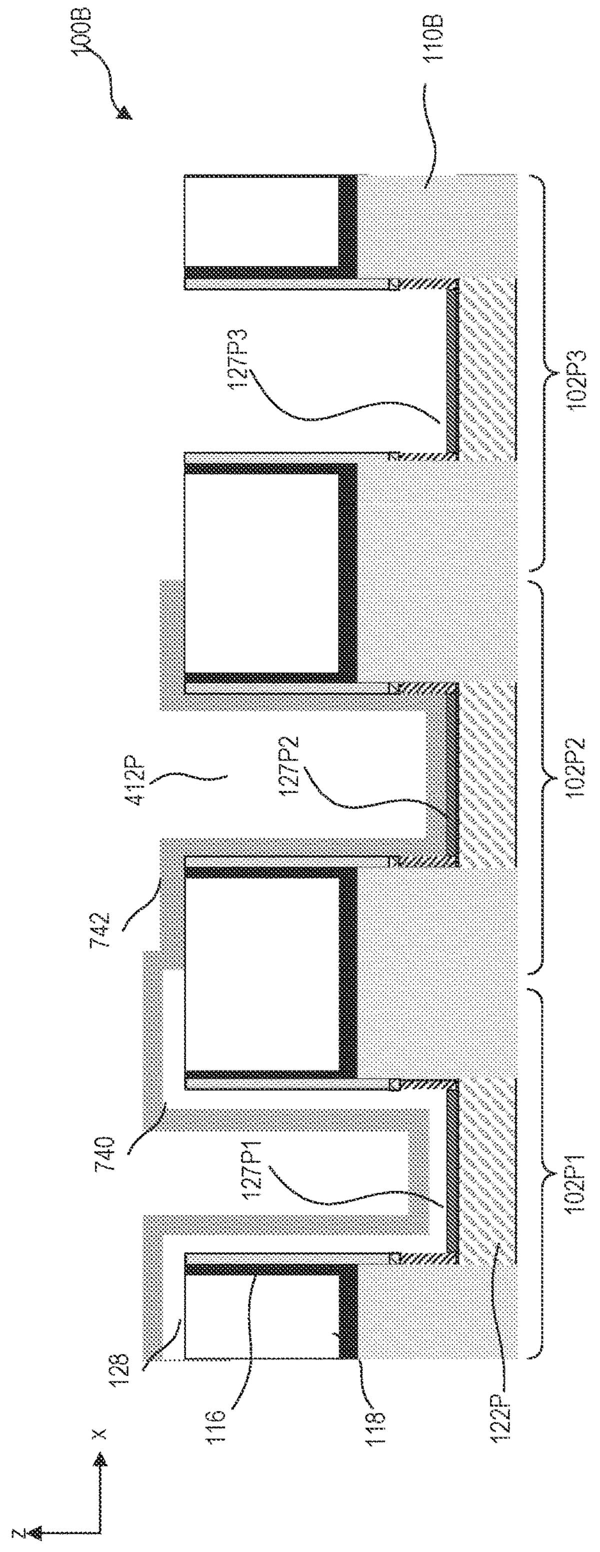
Figure 7E:
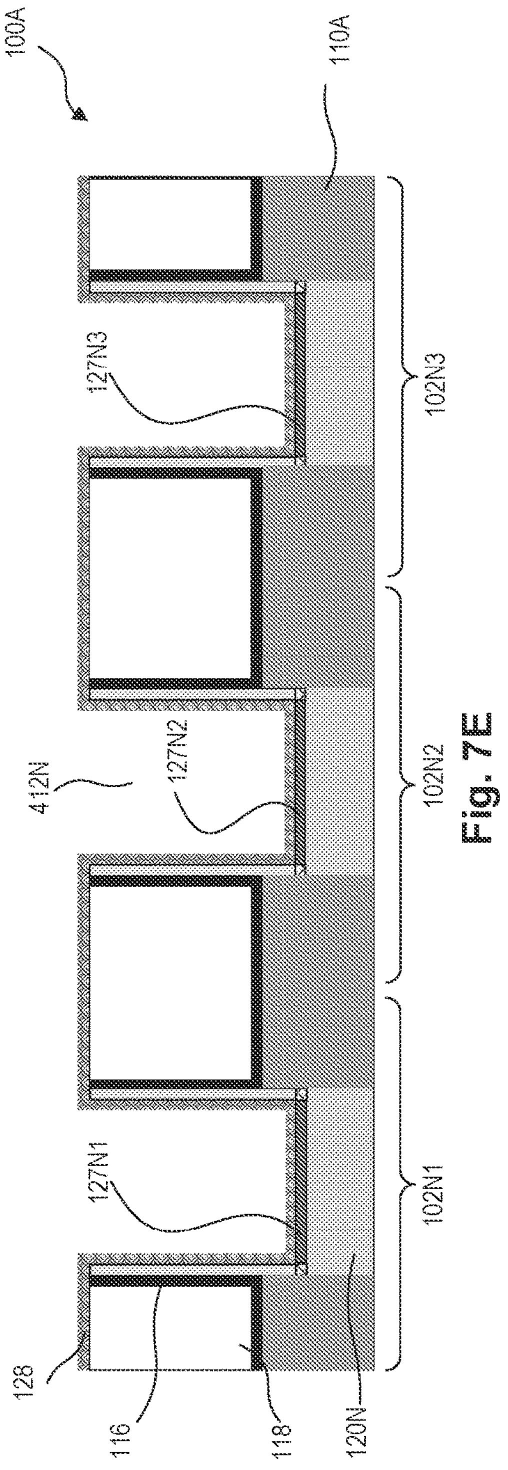
Figure 7F:
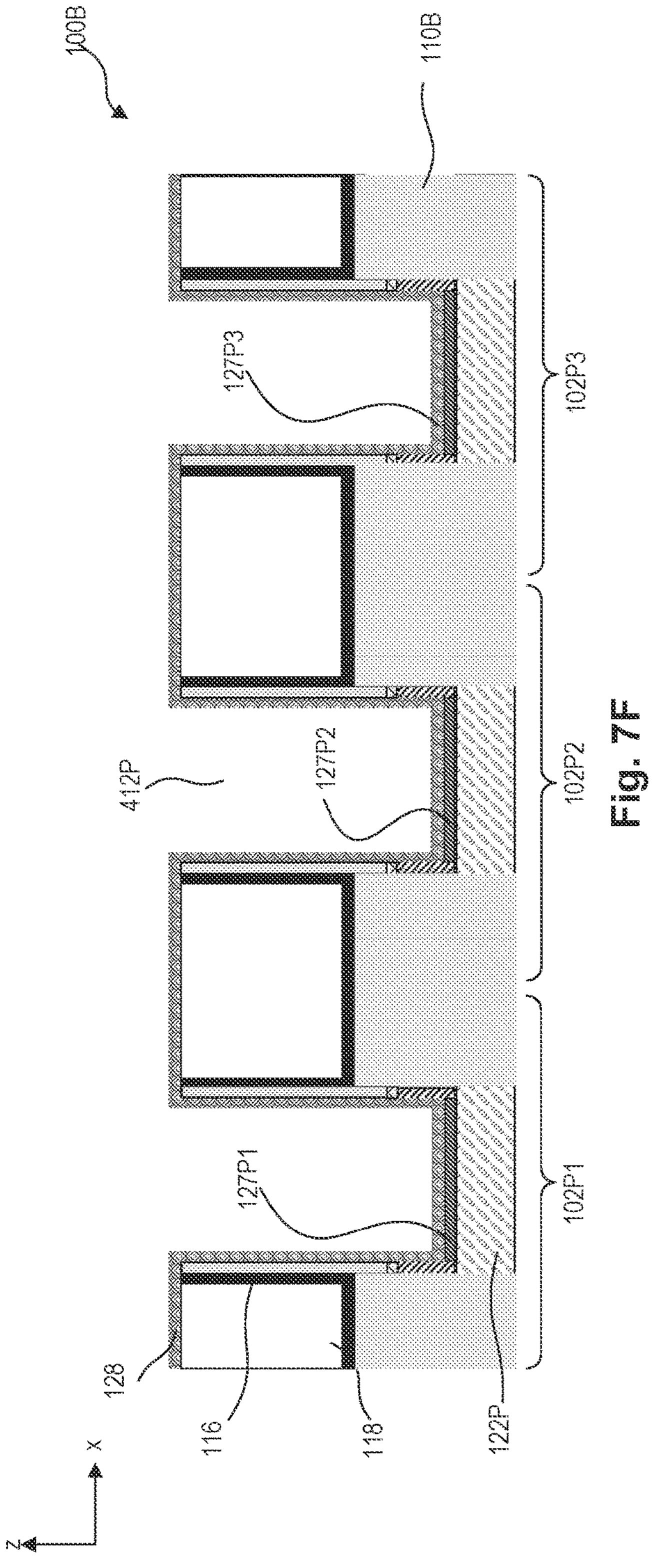

In some embodiments, instead of the doping process in HK gate dielectric layer 128, as described with reference to FIGS. 6A-6B and 7A-7B, IO layers 127N1-127N3 and 127P1-127P3 of NFETs 102N1-102N2 and PFETs 102P1-102P2 can be doped with different amount of dopants prior to the deposition of HK gate dielectric layer 128 as shown in FIGS. 7C-7D. The doping process of IO layers 127N1-127N3 and 127P1-127P3 can be similar to the doping process of HK gate dielectric layer 128 described with reference to FIGS. 7A-7B. The doping process of IO layers 127N1-127N3 and 127P1-127P3 can include sequential operations of (i) blanket depositing a first dopant source layer (not shown) on IO layers 127N1-127N3 and 127P1-127P3, (ii) patterning the first dopant source layer to form a patterned first dopant source layer 740 as shown in FIGS. 7C-7D, (iii) blanket depositing a second dopant source layer (not shown) on the structures formed after the patterning of the first dopant source layer, (iv) patterning the second dopant source layer to form a patterned second dopant source layer 742 as shown in FIGS. 7C-7D, (iii) performing a drive-in anneal process on the structures of FIGS. 7C-7D to incorporate dopant into top portions of IO layers 127N1-127N3 and 127P1-127P3, and (iv) removing first and second dopant source layers 740 and 742. The doping process of IO layers 127N1-127N3 and 127P1-127P3 can be followed by the deposition of HK gate dielectric layer 128 as shown in FIGS. 7E-7F. The deposition of HK gate dielectric layer 128 of FIGS. 7E-7F can be similar to the deposition process of HK gate dielectric layer 128 described with reference to FIGS. 5A-5B.

Referring to FIG. 2, in operation 230, dopant concentration profiles across the doped portions of the HK gate dielectric layer are adjusted. For example, as illustrated with reference to FIGS. 8A-11B and 11C-11D, dopant concentration profiles across HK gate dielectric layer 128 can be adjusted using first and second dopant control layers **129*-130*, a two-stage annealing process, and a Si capping layer 1144. The dopant concentration profile adjusting process can include sequential operations of: (i) forming first and second dopant control layers 129*-130* (as shown in FIGS. 8A-9B) on the structures of FIGS. 6A-6B after removing dopant source layer 640 (or on the structures of FIGS. 7A-7B after removing dopant source layers 740 and 742 or on the structures of FIGS. 7E-7F), (ii) performing a first anneal process on the structures of FIGS. 9A-9B as shown in FIGS. 10A-10B, (iii) blanket depositing Si capping layer 1144 on the first annealed structures of FIGS. 10A-10B as shown in FIGS. 11A-11B, (iv) performing a second anneal process on the structures of FIGS. 11A-11B, and (v) removing Si capping layer 1144. In some embodiments, first and second dopant control layers 129*-130* can be removed (not shown) after removing Si capping layer 1144**.

Figure 8A:
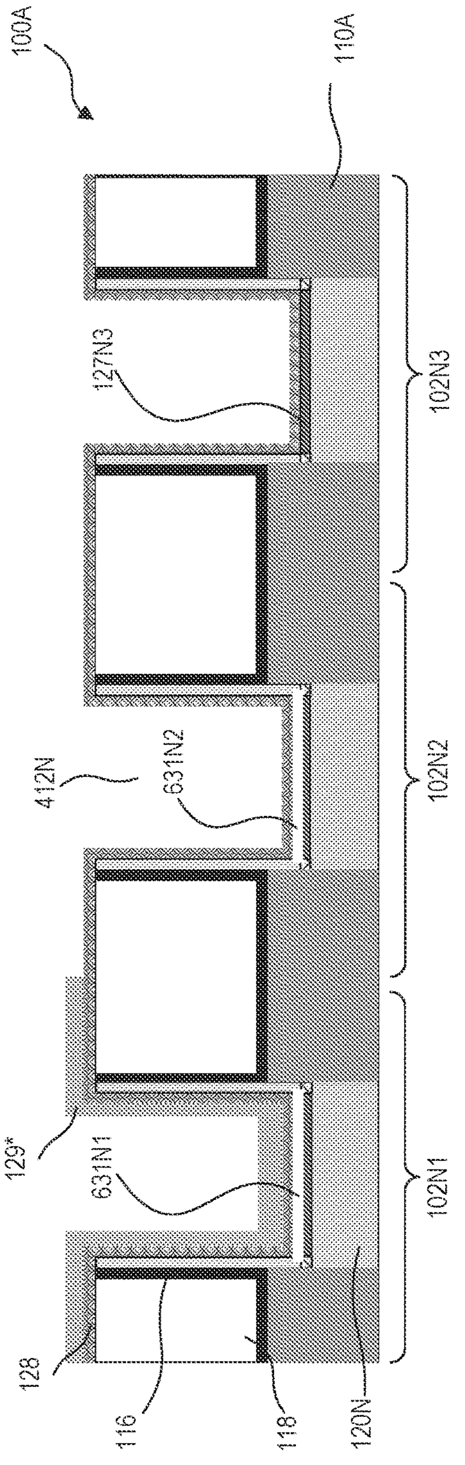
Figure 8B:
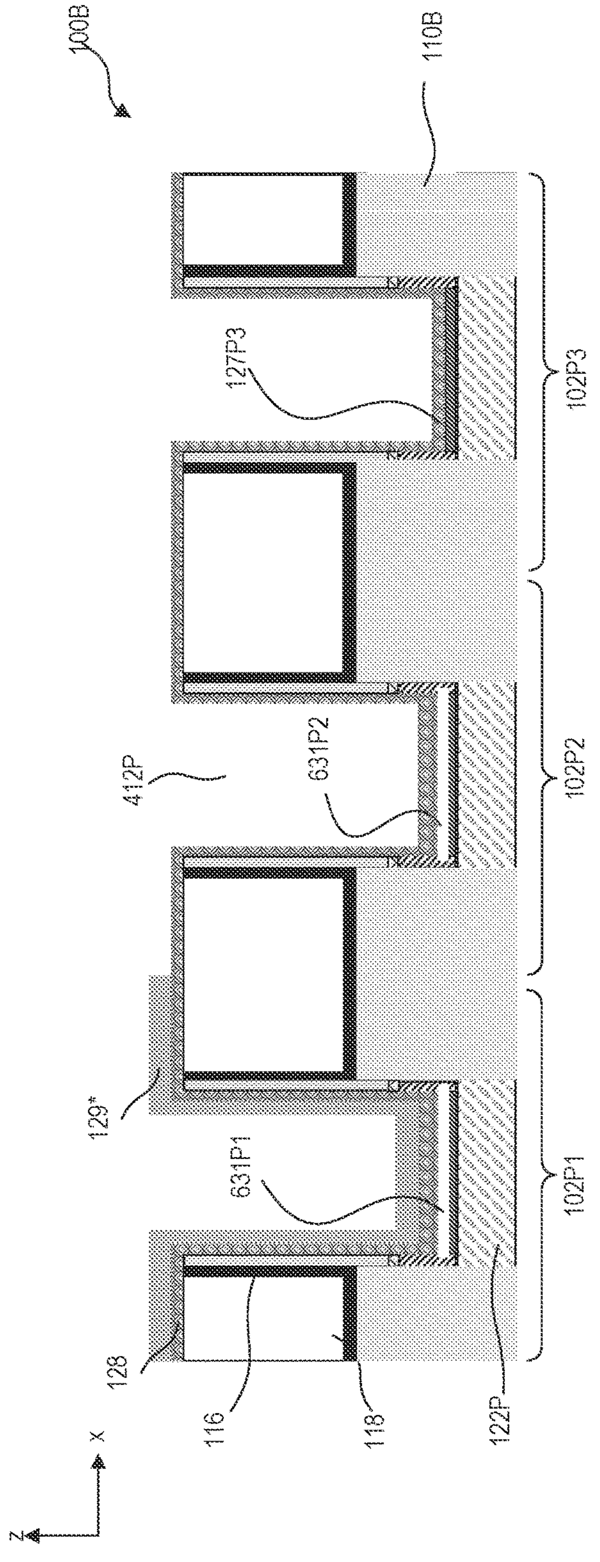
Figure 9A:
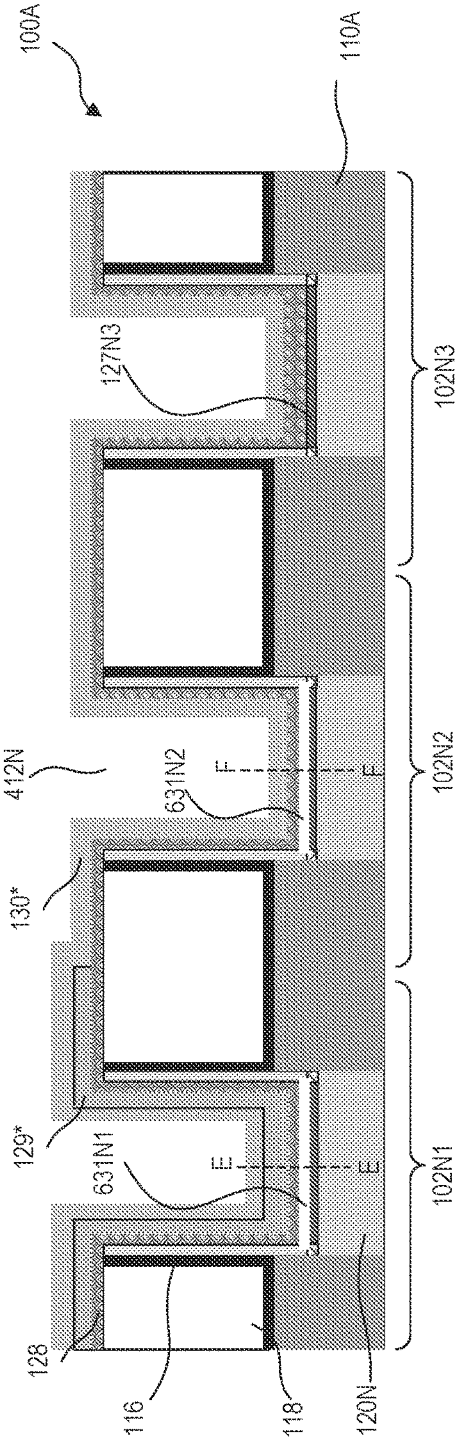
Figure 9B:
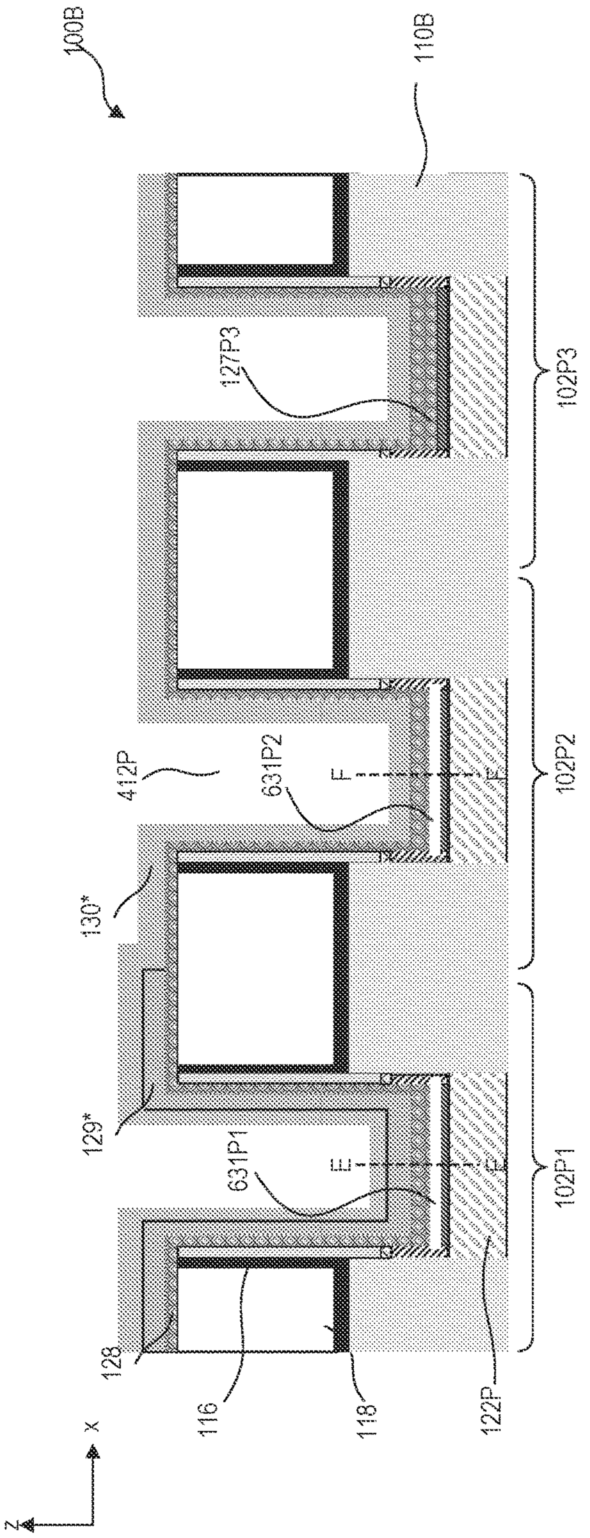
Figures 10A, 10B:
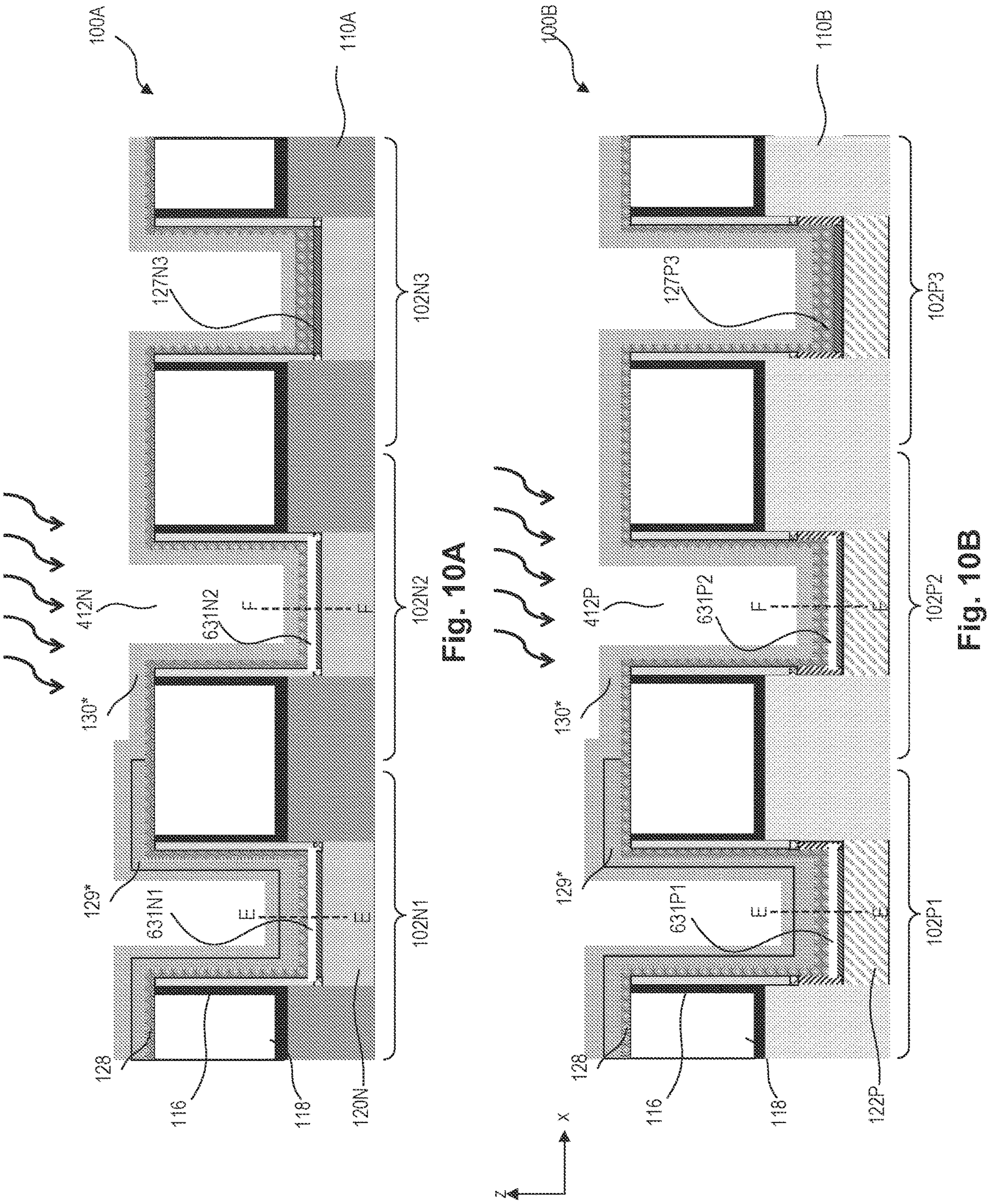

The process for forming first and second dopant control layers **129*-130* can include sequential operations of (i) blanket depositing a first dopant control layer (not shown) on the structures of FIGS. 6A-6B after removing dopant source layer 640 (or on the structures of FIGS. 7A-7B after removing dopant source layers 740 and 742), (ii) patterning the first dopant control layer to form patterned first dopant control layer 129* as shown in FIGS. 8A-8B, and (iii) blanket depositing second dopant control layer 130* on the structures of FIGS. 8A-8B as shown in FIGS. 9A-9B. After the formation of dopant control layers 129*-130, the dopant concentration profiles across gate structures 112N1-112N2 are similar to each other and the dopant concentration profiles across gate structures 112P1-112P2 are similar to each other (not shown). During subsequent processing, first and second dopant control layers 129*-130* can form first and second dopant control layers 129-130 of FIGS. 1A-1**E.

The blanket deposition of the first and second dopant control layers **129*-130* can include blanket depositing about 0.8 nm to about 5 nm thick materials for the first and second dopant control layers 129*-130* on HK gate dielectric layer 128 with an ALD or a CVD process. The materials for first and second dopant control layers 129*-130* can include TiSiN, Si, $SiO_2$, SiTi, Ge, SiGe, $TaSi_2$, $TiSi_2$, NiSi, $WSi_2$, $MoSi_2$, TiN or a combination thereof. In some embodiments, the blanket depositing of first dopant control layer 129* can include depositing a TiSiN layer with about 0 atomic % (e.g., TiN) to about 30 atomic % of Si with respect to Ti. The blanket depositing of second dopant control layer 130*** can include depositing a TiSiN layer with about 30 atomic % to about 100 atomic % (e.g., SiN) of Si with respect to Ti.

To deposit the TiSiN layers with such Si concentrations in first and second dopant control layers **129*-130* that are different from each other, the TiSiN deposition processes can include using Si precursors, Ti precursors, and N precursors at a temperature ranging from about 300° C. to about 550° C. In some embodiments, Si precursor can include Silane ($SiH_4$), Disilane ($Si_2H_6$), Dichlorosilane ($SiH_2Cl_2$), Hexachlorodisilane ($Si_2Cl_6$), Dimethyl dichlorosilane ($Si(CH_3)_2Cl_2$), TEOS ($Si(OC_2H_5)_4$), Trichlorosilane ($SiHCl_3$), Trichloro disilane ($Si_2H_3Cl_3$), Hexa-methyl disilane ($(Si(CH_3)_3)_2$), or Tetra-ethyl silane ($Si(C_2H_5)_4$). In some embodiments, Ti precursor can include Titanium tetrachloride ($TiCl_4$), TDMAT—Tetrakis-dimethylamido-titanium($Ti(N(CH_3)_2)_4$), or TDMADT—tris(dimethylamido)-(dimethylamino-2-propanolato)titanium ($Ti(NMe_2)_3(dmap)$). In some embodiments, N precursor can include Ammonia ($NH_3$), Hydrazine($N_2H_4$), Forming gas ($N_2$+$H_2$), $NH_3$, $N_2$, $H_2$ plasma, or cracked ammonia. In some embodiments, the TiSiN layers for first and second dopant control layers 129*-130*** can be deposited using $TiCl_4$, $SiH_4$, and $NH_3$ at a temperature ranging from about 400° C. to about 460° C.

The first annealing process can include performing a isothermal soaking annealing at a temperature of about 500° C. to about 700° C. followed by a spike annealing process on the structures of FIGS. 9A-9B in a nitrogen ambient at an annealing temperature ranging from about 850° C. to about 900° C. for a time period ranging from about 1 second to about 5 seconds. The blanket deposition of Si capping layer 1144 can include depositing a silicon-based layer with a thickness of about 2 nm to about 5 nm on second dopant control layer 130* by an ALD, a CVD, or a PVD process using $SiH_4$, disaline ($Si_2H_6$), and hydrogen at a temperature ranging from about 350° C. to about 450° C. The second annealing process can include performing a spike annealing process in a nitrogen ambient at an annealing temperature (e.g., about 900° C. to about 950° C.) higher than that of the first annealing process for a time period ranging from about 1 second to about 10 seconds. FIGS. 11C-11D illustrate the changes in the dopant concentration profiles along lines E-E and F-F of FIGS. 9A-11B at various stages of the adjusting process.

Figure 11E:
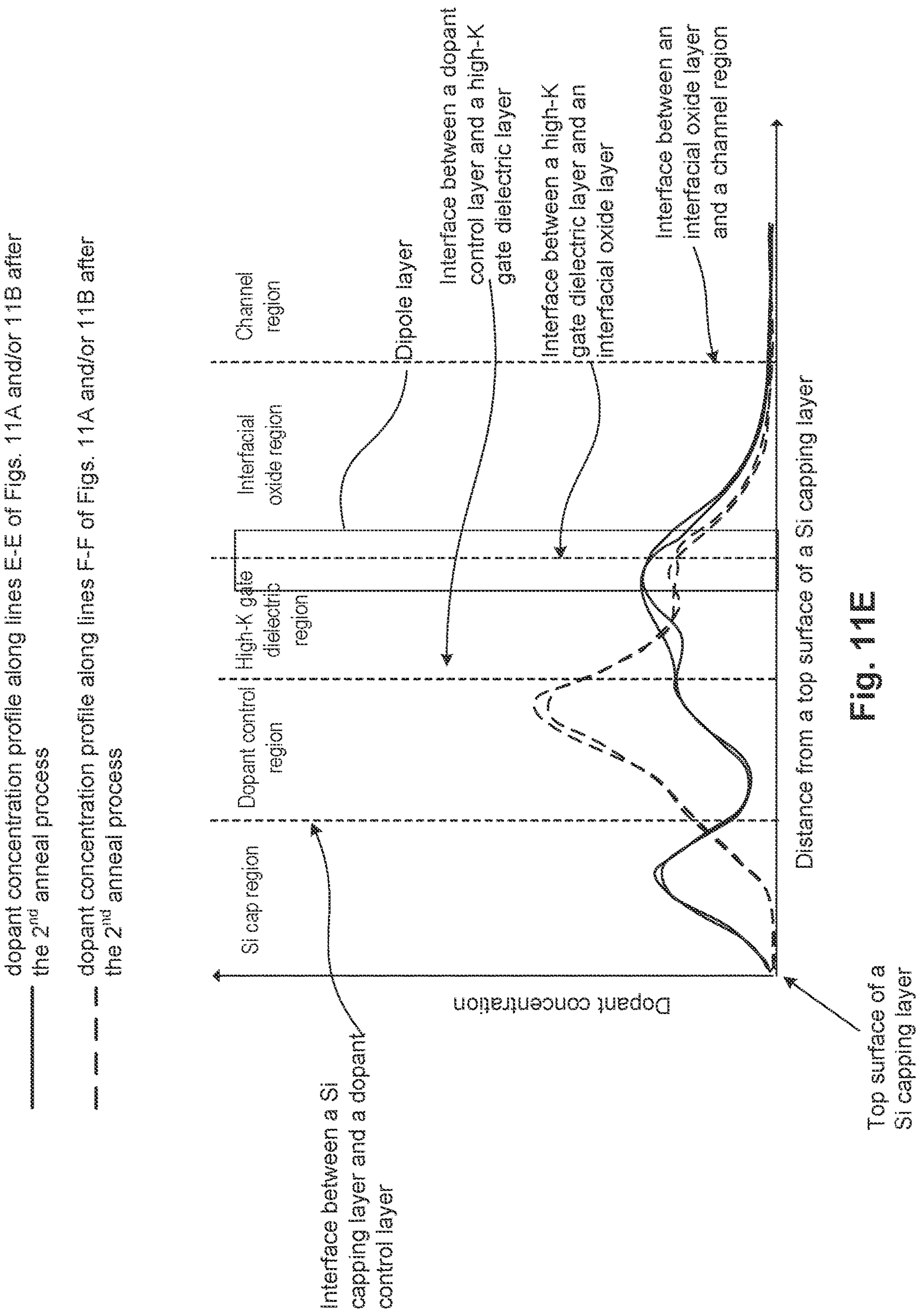
Figure 12A:
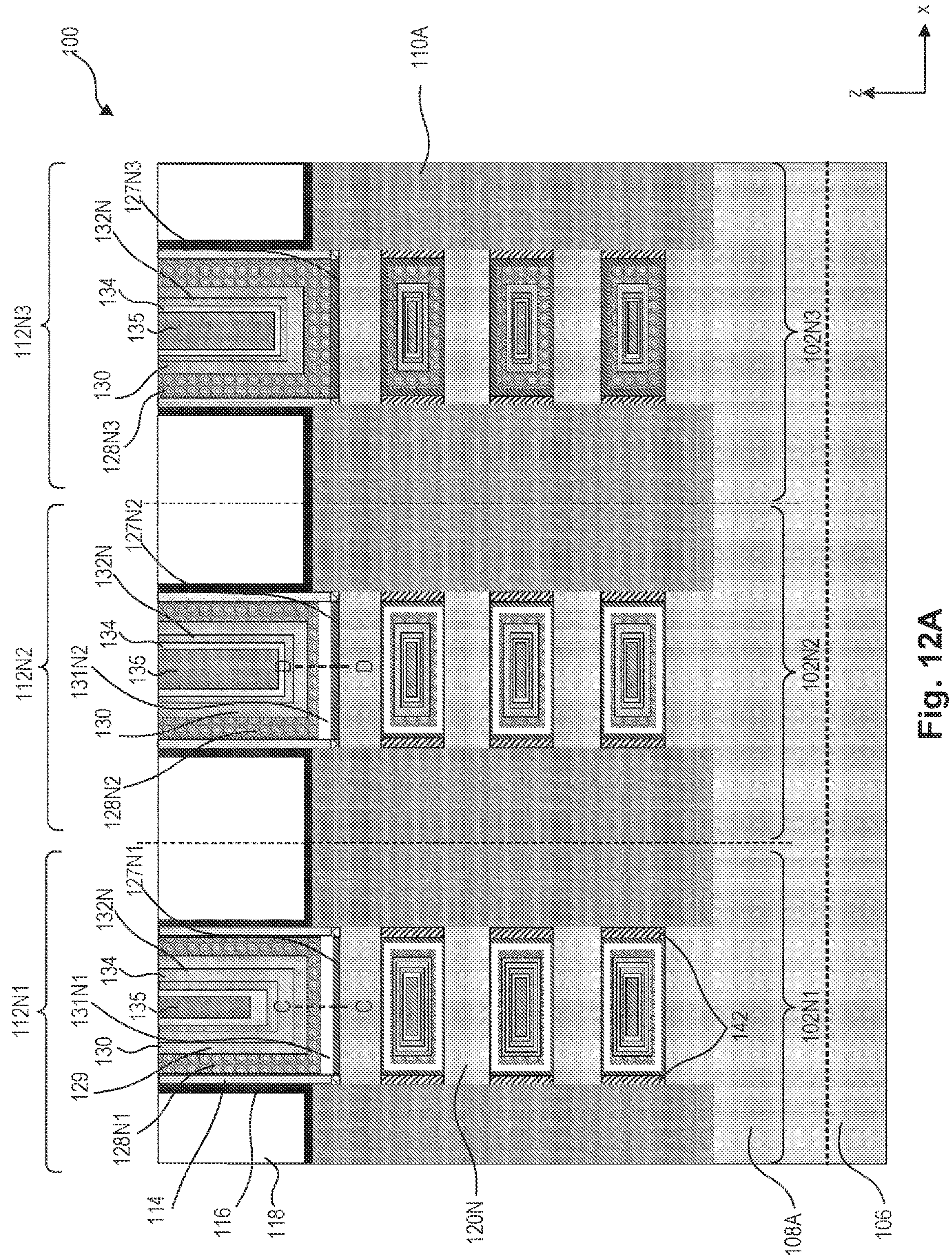
Figure 12B:
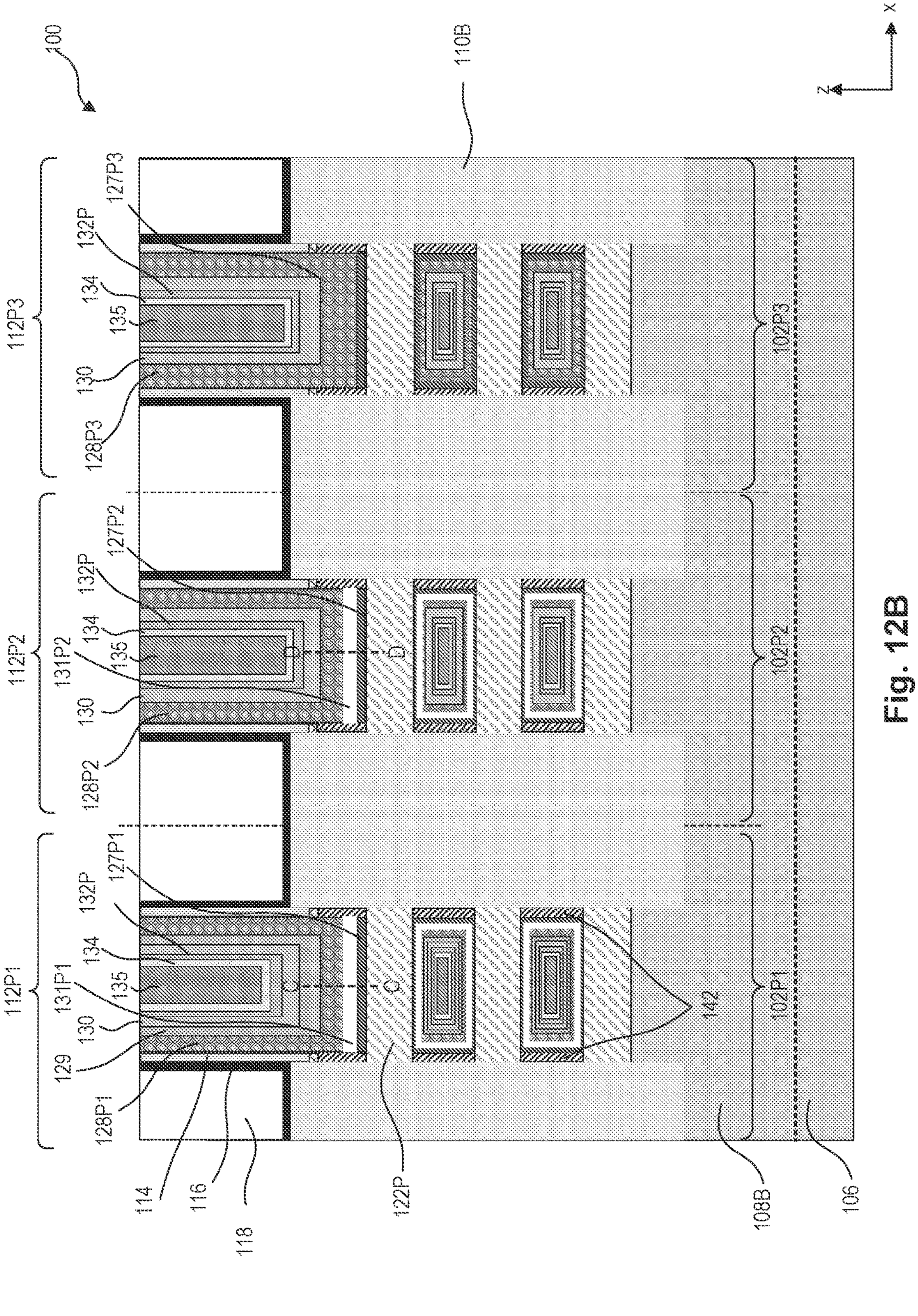

FIG. 11E illustrates the dopant concentration profiles along lines E-E and F-F of FIGS. 11A-11B after the adjusting process. After the formation of dopant control layers **129*-130* as shown in FIGS. 9A-9B, the dopant concentration profiles across gate structures 112N1-112N2 are similar to each other and the dopant concentration profiles across gate structures 112P1-112P2 are similar to each other (not shown). However after operation 230, the dopant concentration profiles across gate structure 112N1-112N2 are different from each other and the dopant concentration profiles across gate structures 112P1-112P2 are different from each other as shown in FIG. 11E. Thus different dipole control layers, such as dopant control layers 129*-130* can be used to form different dopant concentration profiles in different devices. In some embodiments, these different dipole control layers can remain in gate structures as shown FIGS. 1B-1C. In some embodiments, the different dipole control layers can be removed from gate structures as shown FIGS. 1V-1W and have dopant concentration profiles as shown in FIG. 11E. Referring to FIG. 2, in operation 235, WFM layers, glue layers, FFW layers, and gate metal fill layers are formed on the second dopant control layer if the first and second dopant control layers are not removed in operation 230 or formed on HK dielectric layer 128 if the first and second dopant control layers are removed. For example, as shown in FIGS. 12A-12B, WFM layers 132N-132P, glue layers (not shown), FFW layers 134, and gate metal fill layers 135 can be formed on the structures of FIGS. 11A-11B. The materials for WFM layers 132N-132P can be blanket deposited on the structures of FIGS. 11A-11B. The material for FFW layers 134 can be blanket deposited on the material for WFM layers 132N-132P. The material for gate metal fill layers 135 can be blanket deposited on the material for FFW layers 134. Following these blanket depositions, HK gate dielectric layer 128, first and second dopant control layers 129*-130*, the materials for WFM layers 132N-132P, the material for FFW layers 134, and the material for gate metal fill layers 135 can be polished by a chemical mechanical polishing process to form the structures of FIGS. 12A-12B. Thus, as described in operations 215-235, gate structures 112N1-112N3 and 112P1-112P3 can be formed with at least three different threshold voltages on the same substrate 106**.

The present disclosure provides example multi-Vt devices with FETs (e.g., GAA FETs and/or finFETs) having threshold voltages different from each other and provides example methods of forming such FETs on the same substrate. The example methods form NFETs and PFETs with WFM layer of similar thicknesses or without WFM layers, but with different threshold voltages on the same substrate. These example methods can be more cost-effective (e.g., cost reduced by about 20% to about 30%) and time-efficient (e.g., time reduced by about 15% to about 20%) in manufacturing reliable FET gate structures with different threshold voltages than other methods of forming FETs with similar channel dimensions and threshold voltages on the same substrate. In addition, these example methods can form FET gate structures with smaller dimensions (e.g., thinner gate stacks) than other methods of forming FETs with similar threshold voltages. Furthermore these example methods can form FET gate structures with improved device performance (e.g., lower flicker noise, higher k value, lower CET, higher speed etc.).

In some embodiments, multiple NFETs and PFETs with different gate structure configurations, but with similar WFM layer thicknesses, and with similar overall total dopant dosage can be selectively formed on the same substrate to achieve threshold voltages different from each other. The different gate structures can have same initial amount of total overall dopant dosage (obtained by similar dopant source layer thicknesses on different gate structures as shown in 102N1, 102N2 in FIG. 6A). These different gate structures can then have different dopant control layers of different compositions disposed and patterned on high-K (HK) gate dielectric layers. The different dopant control layers can provide different concentration profiles of metal dopants in the HK gate dielectric layers and at HK-IO interfaces of the different gate structure. The different metal dopant concentration profiles can induce dipoles of different concentrations at HK-IO interfaces. The different dipole concentrations result in gate structures with different EWF values, threshold voltages and flat band voltage shifts. Thus, tuning the composition of the dopant control layers can tune the EWF values of the NFET and PFET gate structures and, as a result, can adjust the threshold voltages of the NFETs and PFETs without varying their WFM layer thicknesses or even without varying the initial total dopant dosage amount in their gate structure. Also the different metal dopant concentration profiles can induce different dopant concentrations in HK gate dielectric layers. The different dopant concentration in HK gate dielectric layers result in different k-values of HK gate dielectric layers, different CET values and different charge scattering and different flicker noise performance. Thus, tuning the composition of dopant layer can also tune the NFET and PFET device performance.

In some embodiments, a method includes forming first and second gate openings on a fin structure, forming first and second interfacial oxide (IO) layers within the first and second gate openings, respectively, depositing a high-K (HK) gate dielectric layer with first and second layer portions within the first and second gate openings, respectively, performing a doping process with a metal-based dopant on the first and second layer portions, selectively forming a first dopant control layer with a first Si concentration on the first layer portion, and depositing a second dopant control layer with a second Si concentration on the second layer portion. The second Si concentration is greater than the first Si concentration. The method further includes adjusting first and second dopant concentration profiles across the first and second layer portions, respectively, such that a first interface between the first layer portion and the first IO layer has a first dopant concentration and a second interface between the second layer portion and the second IO layer has a second dopant concentration that is smaller than the first dopant concentration and depositing a gate metal fill layer on the first and second layer portions.

In some embodiments, a method includes forming first and second interfacial oxide (IO) layers on a fin structure, depositing a high-K (HK) gate dielectric layer with first and second layer portions on the first and second IO layers, respectively, depositing a first dopant source layer on the first layer portion, depositing a second dopant source layer with a first portion on the first dopant source layer and a second portion on the second layer portion, removing the first and second dopant source layers, selectively forming a first dopant control layer on the first layer portion, depositing a second dopant control layer with a silicon (Si)-to-metal atomic concentration ratio greater than a Si-to-metal atomic concentration ratio of the first dopant control layer, and depositing a gate metal fill layer on the second dopant control layer.

In some embodiments, a semiconductor device includes a substrate, a fin structure disposed on the substrate, and first and second gate structures on the fin structure. The first and second gate structures includes first and second interfacial oxide (IO) layers, respectively, first and second high-K (HK) gate dielectric layers disposed on the first and second IO layers, respectively, and first and second dopant control layers disposed on the first and second HK gate dielectric layers, respectively. The second dopant control layer has a silicon (Si)-to-metal atomic concentration ratio greater than an Si-to-metal atomic concentration ratio of the first dopant control layer. The semiconductor device further includes first and second work function metal layers disposed on the first and second dopant control layers, respectively, and first and second gate metal fill layers disposed on the first and second work function metal layers, respectively.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
- a substrate;
- a fin structure disposed on the substrate;
- first and second nanostructured layers disposed on the fin structure; and
- first and second gate structures surrounding the first and second nanostructured layers, respectively, comprising:
  - first and second interfacial oxide (IO) layers, respectively;

first and second high-K (HK) gate dielectric layers disposed on the first and second IO layers, respectively, wherein the first and second HK gate dielectric layers comprise first and second dopants, respectively, wherein the first HK gate dielectric layer comprises a first dopant concentration profile with an increasing slope from a top surface to a bottom surface of the first HK gate dielectric layer; and wherein the second HK gate dielectric layer comprises a second semiconductor concentration profile with a decreasing slope from a top surface to a bottom surface of the second HK gate dielectric layer;

first and second dopant control layers disposed on the first and second HK gate dielectric layers, respectively; and first and second gate metal fill layers disposed on the first and second HK gate dielectric layers, respectively.

2. The semiconductor device of claim 1, wherein the second dopant control layer has a silicon (Si)-to-metal atomic concentration ratio greater than an Si-to-metal atomic concentration ratio of the first dopant control layer.

3. The semiconductor device of claim 1, wherein the second dopant control layer has a silicon (Si)-to-titanium (Ti) atomic concentration ratio greater than an Si-to-Ti atomic concentration ratio of the first dopant control layer.

4. The semiconductor device of claim 1, wherein an interface between the second HK gate dielectric layer and the second IO layer has a concentration of the second dopants that is less than the second concentration of the first dopants at an interface between the first HK gate dielectric layer and the first IO layer.

5. The semiconductor device of claim 1, wherein a first interface between the first HK gate dielectric layer and the first dopant control layer has a first silicon (Si) concentration, and wherein a second interface between the second HK gate dielectric layer and the second dopant control layer has a second Si concentration that is greater than the first Si concentration.

6. The semiconductor device of claim 1, wherein an interface between the second HK gate dielectric layer and the second dopant control layer has a dopant concentration of the second dopants that is greater than the first concentration of the first dopants at an interface between the first HK gate dielectric layer and the first dopant control layer.

7. The semiconductor device of claim 1, wherein the first and second dopants comprise metal-based dopants, and wherein a dopant concentration of the first dopants in the first HK gate dielectric layer is less than a dopant concentration of the second dopants in the second HK gate dielectric layer.

8. The semiconductor device of claim 1, wherein a first concentration of silicon (Si) in a top portion of the first HK gate dielectric layer is less than a second concentration of Si in a top portion of the second HK gate dielectric layer.

9. The semiconductor device of claim 1, wherein the first and second dopant control layers comprise titanium silicon nitride layers of different silicon-to-titanium atomic concentration ratio.

10. The semiconductor device of claim 1, wherein the first dopant control layer comprises a titanium silicon nitride (TiSiN) layer with about 0 atomic % to about 30 atomic % of Si with respect to Ti.

11. The semiconductor device of claim 1, wherein the second dopant control layer comprises a titanium silicon nitride (TiSiN) layer with about 30 atomic % to about 100 atomic % of Si with respect to Ti.

12. The semiconductor device of claim 1, further comprising first and second work function metal layers disposed on the first and second dopant control layers, respectively.

13. A semiconductor device, comprising:

a substrate;

a fin structure disposed on the substrate; and a gate structure disposed on the fin structure, comprising:

a high-K (HK) gate dielectric layer disposed on the fin structure;

a first nitride layer disposed on the HK gate dielectric layer;

a second nitride layer disposed on the first nitride layer, wherein the second nitride layer has a semiconductor-to-metal atomic concentration ratio greater than a semiconductor-to-metal atomic concentration ratio of the first nitride layer, wherein the first nitride layer comprises a first semiconductor concentration profile with a decreasing slope from a top surface to a bottom surface of the first nitride layer; and wherein the second nitride layer comprises a second semiconductor concentration profile with an increasing slope from a top surface to a bottom surface of the second nitride layer; and a gate metal fill layer disposed on the second nitride layer.

14. The semiconductor device of claim 13, wherein the first and second nitride layers comprise titanium silicon nitride layers of different silicon-to-titanium atomic concentration ratio.

15. The semiconductor device of claim 13, wherein the first nitride layer comprises a titanium silicon nitride (TiSiN) layer with about 0 atomic % to about 30 atomic % of Si with respect to Ti.

16. The semiconductor device of claim 13, wherein the second nitride layer comprises a titanium silicon nitride (TiSiN) layer with about 30 atomic % to about 100 atomic % of Si with respect to Ti.

17. A method, comprising:

depositing a high-K (HK) gate dielectric layer with first and second layer portions on a fin structure on a substrate;

depositing a first nitride layer on the first and second layer portions, comprising depositing the first nitride layer with a first semiconductor concentration profile that has a decreasing slope from a top surface to a bottom surface of the first nitride layer;

removing a portion of the first nitride layer to expose the second layer portion;

depositing a second nitride layer on the first nitride layer and the second layer portion, comprising depositing the second nitride layer with a second semiconductor concentration profile that has an increasing slope from a top surface to a bottom surface of the second nitride layer, wherein the second nitride layer comprises a semiconductor-to-metal atomic concentration ratio greater than a semiconductor-to-metal atomic concentration ratio of the first nitride layer; and depositing a gate metal fill layer on the second nitride layer.

18. The method of claim 17, wherein depositing the first nitride layer comprises depositing a titanium silicon nitride (TiSiN) layer with about 0 atomic % to about 30 atomic % of Si with respect to Ti.

19. The method of claim 17, wherein depositing the second nitride layer comprises depositing a titanium silicon nitride (TiSiN) layer with about 30 atomic % to about 100 atomic % of Si with respect to Ti.

20. The method of claim 17, further comprising:
depositing a silicon layer on the second nitride layer;
performing an anneal process on the silicon layer; and
removing the silicon layer.

* * * * *